(12) United States Patent
Takayama et al.

(10) Patent No.: US 7,109,828 B2
(45) Date of Patent: Sep. 19, 2006

(54) SURFACE ACOUSTIC WAVE DEVICE, AND MOBILE COMMUNICATION DEVICE AND SENSOR BOTH USING SAME

(75) Inventors: Ryoichi Takayama, Osaka (JP); Shunichi Seki, Hyogo (JP); Tetsuo Kawasaki, Osaka (JP); Hidekazu Nakanishi, Osaka (JP); Koji Hasegawa, Hokkaido (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 156 days.

(21) Appl. No.: 10/482,442

(22) PCT Filed: Apr. 14, 2003

(86) PCT No.: PCT/JP03/04692

§ 371 (c)(1),
(2), (4) Date: May 4, 2004

(87) PCT Pub. No.: WO03/088483

PCT Pub. Date: Oct. 23, 2003

(65) Prior Publication Data

US 2004/0174233 A1 Sep. 9, 2004

(30) Foreign Application Priority Data

Apr. 15, 2002 (JP) ............................. 2002-111715

(51) Int. Cl.
*H03H 9/25* (2006.01)
*H03H 9/64* (2006.01)
(52) U.S. Cl. .................. 333/193; 333/195; 310/313 A; 310/312; 310/364
(58) Field of Classification Search ........ 333/193–196; 310/313 A
See application file for complete search history.

(56) References Cited

U.S. PATENT DOCUMENTS

| 4,150,346 A | 4/1979 | Auld ........................ 333/189 |
| 6,037,699 A * | 3/2000 | Kobayashi et al. ..... 310/313 A |
| 6,037,847 A | 3/2000 | Ueda et al. ................. 333/193 |

(Continued)

FOREIGN PATENT DOCUMENTS

JP        8-288788        11/1996

(Continued)

OTHER PUBLICATIONS

Koskela et al.; "Suppresion of the Leaky SAW Attenuation With Heavy Mechanical Loading"; IEEE Transactions on Ultrasonics, Ferroelectrics, and Frequency Control, vol. 45, No. 2, Mar. 1998, pp. 439-449.*

*Primary Examiner*—Barbara Summons
(74) *Attorney, Agent, or Firm*—Wenderoth, Lind & Ponack, L.L.P.

(57) ABSTRACT

In a surface acoustic wave (SAW) device, such as a SAW resonator or a SAW filter, loss is minimized and steep characteristics are improved. IDT electrodes and a reflector are provided to a piezoelectric substrate cut out at a cut-angle which allows the substrate to excite a leaky surface acoustic wave (LSAW). The IDT electrodes have a given film thickness and a given pitch "p" of finger-electrodes. A phase velocity of the SAW is reduced to slower than a phase velocity "vb" of a slow shear wave propagating on the piezoelectric substrate, and a resonance frequency "f" satisfies a relation of $2 \times p \leq vb/f$. This structure allows the use of a Rayleigh surface acoustic wave (RSAW) which does not produce propagation loss, and improving insertion-loss and steep characteristics from those of a conventional SAW device using the LSAW.

51 Claims, 21 Drawing Sheets

U.S. PATENT DOCUMENTS 6,271,617 B1  8/2001  Yoneda et al. .......... 310/313 D
6,366,002 B1  4/2002  Kadota ................... 310/313 A

FOREIGN PATENT DOCUMENTS

| JP | 9-167936 | 6/1997 |
| JP | 11-74751 | 3/1999 |
| JP | 11-97973 | 4/1999 |
| JP | 2001-77662 | 3/2001 |

* cited by examiner

SURFACE ACOUSTIC WAVE DEVICE, AND MOBILE COMMUNICATION DEVICE AND SENSOR BOTH USING SAME

TECHNICAL FIELD

The present invention relates to surface acoustic wave devices having excellent pass-band characteristics, particularly in a high-frequency band, and it also relates to mobile communication apparatuses and sensors both using the same devices.

BACKGROUND ART

A surface acoustic wave device (hereinafter referred to as a SAW device) is widely used as a filter or a resonator in radio apparatuses of mobile communication terminals because of its small size and low weight. Since cellular phone systems use higher frequencies, those filters used in the radio apparatuses of mobile communication terminals need to work in the high frequency range between 800 MHz and several GHz, among others. Those filters are required to have low loss in the pass-band, highly attenuate signals in the rejection band, and yet, have steep filter characteristics.

In general, application of a voltage to an inter-digital transducer (IDT), of which finger-electrodes formed on a piezoelectric-substrate mesh with each other, produces a surface acoustic wave (SAW) propagating on the substrate. The SAW device excites and receives this SAW, thereby achieving the filter characteristics needed. The electrical characteristics of the SAW device are based mainly on a shape and a structure of the IDT electrodes, as well as the propagation characteristics of the SAW propagating on the piezoelectric substrate. For instance, a SAW resonator, which is one of the SAW devices, has the following relation:

$$v = 2 \cdot p \cdot f \qquad \text{equation (1)}$$

where p=pitch of the finger-electrodes of the IDT electrodes, v=phase velocity, namely, propagation speed of the SAW, and f=resonance frequency.

Use of a SAW device at a high frequency band increases resonance frequency f, and if propagation speed v is constant, pitch p of IDT finger-electrodes must be reduced. This means that the pattern width of the IDT electrodes should be extremely narrow, which results in lowering the manufacturing yield rate of the SAW devices. To avoid the lowering of the yield rate, a piezoelectric substrate allowing the SAW to propagate at a higher speed (v) is required. To obtain the characteristic of low loss, it is necessary to reduce propagation loss of the SAW and resistance of the IDT electrode as much as possible.

To obtain a SAW device, such as a SAW filter and a SAW resonator of low loss at a high frequency band, the foregoing points must be taken into account. The following two substrates have been thus widely used to obtain the SAW devices. A substrate made of single crystal LiTaO$_3$ (hereinafter referred to as LT single-crystal) has undergone a 36° rotation and a Y-cut. The SAW propagates in the X direction of this resultant substrate, and this substrate is called a 36° Y-X LiTaO$_3$ substrate (hereinafter referred to as a LT36° substrate). A substrate made of single crystal LiNbO$_3$ (hereinafter referred to as LN single-crystal) has undergone a 64° rotation and a Y-cut. The SAW propagates in the X direction of this resultant substrate, and this substrate is called a 64° Y-X LiNbO$_3$ substrate (hereinafter referred to a LN64° substrate). Use of the LT36° substrate and the LN64° substrate allows the SAW device to use a leaky surface acoustic wave (LSAW) which propagates on the substrate while radiating a bulk wave within the substrate.

The LSAW excited by those substrates has a feature of high phase velocity, i.e., propagation speed. Further, when the mass-load effect of the IDT electrode can be neglected, in other words, the film of the IDT electrode is thinner than the wavelength of LSAW to be propagated, the LSAW scarcely radiates the bulk wave. As a result, propagation loss due to the bulk wave can be substantially reduced. Thus, the LT36° substrate and the LN64° substrate are fitted to form SAW filters and SAW resonators of high-frequency and low loss. This is the reason why those two substrates have been widely used.

However, use of thosee substrates in SAW filters or SAW resonators at a frequency range between 800 MHz–several GHz shortens the wavelength of the SAW, so that the film thickness of the IDT electrode becomes as thick as several %–10-odd % of the wavelength. Thus the mass-load effect of the IDT electrode can no longer be neglected. As a result, the propagation loss produced by propagating the LSAW cannot be neglected.

To overcome this problem, use of a substrate with a larger cut-angle is effective for substantial reduction of propagation loss. This idea is disclosed in Japanese Patent Application Non-Examined Publication No. H09-167936. According to this publication, the cut-angle of the substrate, which minimizes the propagation loss of the LSAW propagating on the LT single-crystal and LN single-crystal, varies in response to normalized film-thickness h/λ of the IDT electrode, where h=film thickness of the electrode, and λ=wavelength of the SAW. In the case of the LT single-crystal, when the film thickness of the IDT electrode becomes 0.03–0.15 of the wavelength of the LSAW (normalized film thickness h/λ is 3%–15%), a shift of the cut-angle from 36° to 39°–46° can almost eliminate the propagation loss. In the same manner, in the case of the LN single-crystal, when the film thickness of the IDT electrode becomes 0.03–0.15 of the wavelength of the LSAW (normalized film thickness h/λ is 3%–15%), a shift of the cut-angle from 64° to a greater angle, such as 66°–74°, can reduce the propagation loss to almost 0 (zero).

However, SAW filters and SAW resonators with different frequency characteristics have different pitches of the IDT electrodes, in general. Thus, if SAW filters or SAW resonators having different frequency characteristics with a flat film-thickness are manufactured, each one of the respective filters or resonators has its own optimum normalized film-thickness h/λ different from the rest. As a result, a structure of two filters in one chip, where two SAW filters having different frequencies are formed on one chip, encounters the following problem. In general, the film thickness of the IDT electrode is flat within one chip. Thus, it is difficult for the two SAW filters to reduce their propagation losses almost to 0 (zero) simultaneously. It is necessary to prepare an optimum film-thickness for each SAW filter within one chip to achieve this goal (propagation loss≈0). However, this goal makes the manufacturing steps complicated, and it is difficult to practically achieve this goal on the manufacturing floor.

Japanese Patent Application Non-Examined Publication No. H05-183380 discloses a method of attenuating signals outside the pass-band, and this method is expected to attenuate the signals to a greater degree than the prior art. The method is to connect a reactance element to a ladder SAW filter, which is formed by coupling SAW resonators in a ladder shape, at an arm of the resonators coupled in parallel. The method actually can achieve substantial attenuation in a certain band-zone by widening the band to be attenuated; however, this method cannot substantially improve the needed steep filter characteristics. Therefore, since PCS, the standard of cellular phones in the U.S., specifies its fractional cross-band {((upper end frequency of the cross-band)−(lower end frequency thereof))/(center frequency thereof)} at 0.01, the pass-band is very close to the rejection band. In such a case, the foregoing method cannot practically attenuate signals in the rejection band close to the pass-band.

SUMMARY OF THE INVENTION

The present invention aims to provide a SAW device having improved steep filter characteristics (steep characteristics) and reduced insertion loss, among others, of a SAW filter and a SAW resonator. The present invention also aims to provide a mobile communication apparatus and a sensor using the SAW device of the present invention. To be more specific, use a piezoelectric substrate cut out at a cut-angle which allows the substrate to excite the LSAW, and reduce the phase velocity of SAW, which has been conventionally used as the LSAW, to a speed slower than a speed of a slow shear wave propagating on the substrate. A Rayleigh surface acoustic wave (RSAW) theoretically free from propagation loss can thus be used, so that less insertion-loss than the SAW device using the conventional LSAW can be expected, and steeper filter characteristics are also expected.

To overcome the problems previously discussed, the SAW device of the present invention comprises:

a piezoelectric substrate that is cut out at a cut-angle allowing the substrate to excite a LSAW; and an electrode pattern formed on the piezoelectric substrate and including IDT electrodes having at least one pair of finger-electrodes meshed with each other.

The pitch "p" of the finger-electrodes of this SAW device satisfies the following relation:

$$2 \times p \leq vb/f$$

where f (Hz)=resonance frequency, vb (m/s)=phase velocity of a slow shear wave propagating on the piezoelectric substrate, and p (m)=pitch of the finger-electrodes of the electrode pattern.

This structure allows the LSAW to suppress the radiation of the bulk-wave, and propagates the LSAW as a RSAW, thereby reducing the propagation loss to almost 0 (zero). As a result, a SAW device having a lower insertion loss than the case where the conventional LSAW is used and having excellent steep characteristics is obtainable.

In addition to the foregoing structure, the SAW device of the present invention further comprises a step formed on the surface of the piezoelectric substrate, and the step has a similar pitch to the pitch "p" of the finger-electrodes which are formed on the top of this step. This structure allows for obtaining a SAW device having a lower insertion loss than the case where the conventional LSAW is used and having excellent steep characteristics. Use of the LSAW as the RSAW incurs reduction in reflection coefficient per electrode. However, this reduction can be also improved at the same time. As a result, ripples in transmission characteristics of the SAW device can be suppressed.

The SAW device of the present invention further comprises dielectric film formed on the electrode pattern such that it covers at least the electrode pattern. This structure allows for lowering the phase velocity due to the formation of the dielectric film, so that a SAW resonator having less insertion loss than the case where the conventional LSAW is used and having excellent steep characteristics is obtainable.

The SAW device of the present invention comprises:

a piezoelectric substrate that is cut out at a cut-angle which allows the substrate to excite a LSAW;

an electrode pattern formed on the piezoelectric substrate and including IDT electrodes having at least one pair of finger-electrodes meshed with each other; and a dielectric film formed on the electrode pattern such that it covers at least the electrode pattern.

The pitch "p" of the finger-electrodes of this SAW device satisfies the following relation:

$$2 \times p \times f_{before} \leq vb \leq 2 \times p \times f_{after}$$

where $f_{before}$ (Hz)=resonance frequency before the dielectric film is formed, $f_{after}$ (Hz)=resonance frequency after the dielectric film is formed, vb (m/s)=phase velocity of a slow shear wave slowly propagating on the piezoelectric substrate, and p (m)=pitch of finger-electrodes of the electrode pattern.

The foregoing structure allows a SAW resonator to reduce insertion loss from one that uses a conventional LSAW even if the phase velocity becomes higher due to the dielectric film formed thereon, and a SAW device having excellent steep characteristics is obtainable.

In the SAW device of the present invention having the foregoing structure, the finger-electrodes are made of aluminum or made from metal mainly comprising aluminum. In this construction, the following relation is satisfied:

$$hL \leq hr,$$

where hL=a film thickness of the IDT electrode of the LSAW-based device formed of this piezoelectric substrate using the LSAW, and hr=a film thickness of the IDT electrode of the SAW device having the same resonance frequency as the foregoing LSAW-base device.

This structure allows lowering the propagation speed of the LSAW due to the mass-load of the IDT electrode, and at the same time, allows for suppressing an increase of the resistance of the electrode film caused by the film thickness of the IDT electrode. As a result, a SAW device having low loss and excellent steep characteristics is obtainable.

The SAW device of the present invention with the foregoing structure uses metal, of which a density is greater than that of aluminum, at least in the finger-electrodes. According to this structure, at least the finger-electrodes of the IDT electrode are made of the metal having a greater density than aluminum, so that lowering of the reflection coefficient per electrode can be restrained (improved). As a result, the ripples occurring in the pass-band or on a somewhat higher frequency side can be suppressed, and a SAW device having excellent steep characteristics is obtainable.

In the SAW device of the present invention with the foregoing structure, at least the finger-electrodes are formed of at least two layers, i.e., a first layer formed of metal of which a density is greater than that of aluminum, and a second layer formed of aluminum or metal comprising mainly aluminum. This structure allows for improving the lowering of the reflection coefficient per electrode. As a result, the ripples occurring in the transmission characteristics can be suppressed, and at the same time, the increasing of resistance of the electrodes can be suppressed, so that a SAW device with low-loss and excellent steep characteristics is obtainable.

The SAW device of the present invention with the foregoing structure has a piezoelectric substrate made of single-crystal of LiTaO₃ (LT single-crystal). This structure allows for forming a SAW device using the conventional LSAW together with the SAW device of the present invention on one chip.

The SAW device of the present invention with the foregoing structure includes the piezoelectric substrate made of the LT single-crystal, and this substrate has a cut-face cut out along the following orientation. With respect to the X-axis of the LT single-crystal, the crystal is rotated along the direction from the Y-axis to the Z-axis by an angle of not less than 26° and not more than 50°. The substrate also has characteristics that can excite the leaky surface acoustic wave (LSAW). When a SAW device using the conventional LSAW and the SAW device of the present invention are formed together on one chip, i.e., a SAW device of a two-device in one-chip is formed, the structure discussed above allows both of the SAW devices to produce low losses and have excellent steep characteristics.

The SAW device of the present invention with the foregoing structure has a piezoelectric substrate made of single-crystal of LiNbO₃ (LN single-crystal). When a SAW device using the conventional LSAW and the SAW device of the present invention are formed together on one chip, i.e. a SAW device of a two-device in one-chip is formed, this structure allows for producing excellent characteristics.

The SAW device of the present invention with the foregoing structure includes the piezoelectric substrate made of LN single-crystal. This substrate has a cut-face cut out along the following orientation. With respect to the X-axis of the LN single-crystal, the crystal is rotated along the direction from the Y-axis to the Z-axis by an angle of not less than 50° and not more than 80°. The substrate also has characteristics that can excite the leaky surface acoustic wave (LSAW). When a SAW device using the conventional LSAW and the SAW device of the present invention are formed together on one chip, i.e., a SAW device of two-device in one-chip is formed, this structure allows both of the SAW devices to produce small losses and have excellent steep characteristics.

The SAW device of the present invention with the foregoing structure includes a plurality of the foregoing SAW devices formed on one chip. This structure allows the SAW device to produce low loss and have a steep selectivity of frequencies.

A mobile communication apparatus of the present invention employs the SAW devices discussed above, so that the SAW device of low-loss and steep characteristics works in the mobile communication apparatus. As a result, a compact, light-weight and slim mobile communication apparatus, such as cellular phone, is obtainable.

A sensor of the present invention employs the SAW device of low-loss and steep characteristics, which is developed by the method disclosed in the present invention, as a sensing section, so that a compact, light-weight, and sensitive sensor is obtainable. This sensor is suitable for sensing a temperature. However, the sensor can also be used for sensing a scent or water content.

PREFERRED EMBODIMENTS OF THE INVENTION

Exemplary embodiments of the SAW device disclosed in the present invention are demonstrated hereinafter with reference to the accompanying drawings.

Exemplary Embodiment 1

Figure 1A:
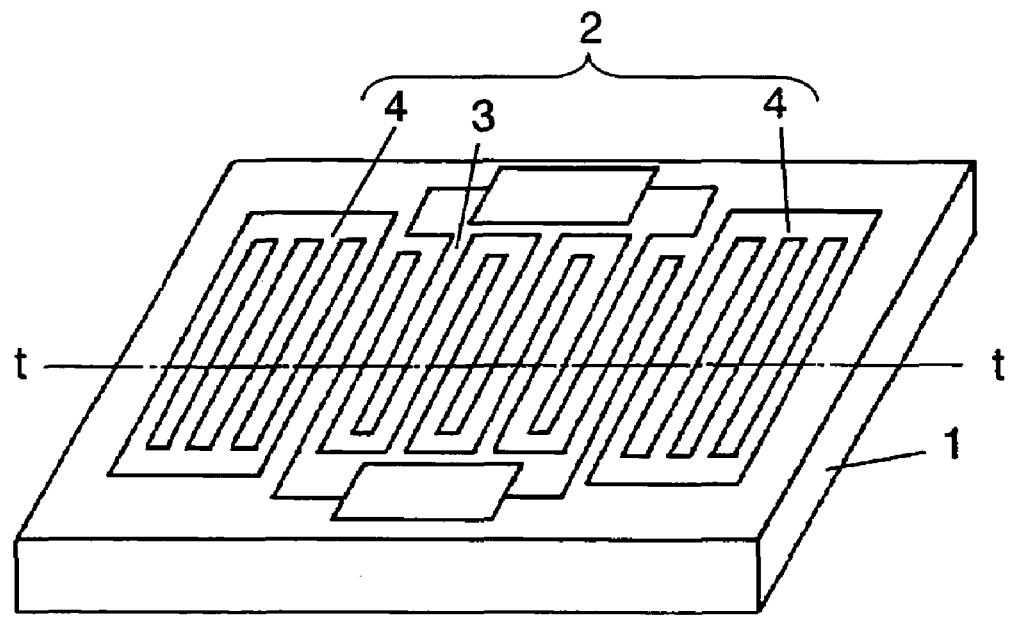
FIG. 1A shows a perspective view of a 1-port SAW resonator produced as an example of a SAW device in accordance with a first exemplary embodiment of the present invention.
Figure 1B:
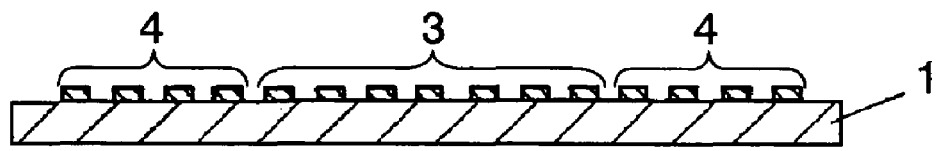
FIG. 1B shows a sectional view taken along the line t—t of FIG. 1A.
Figure 1C:
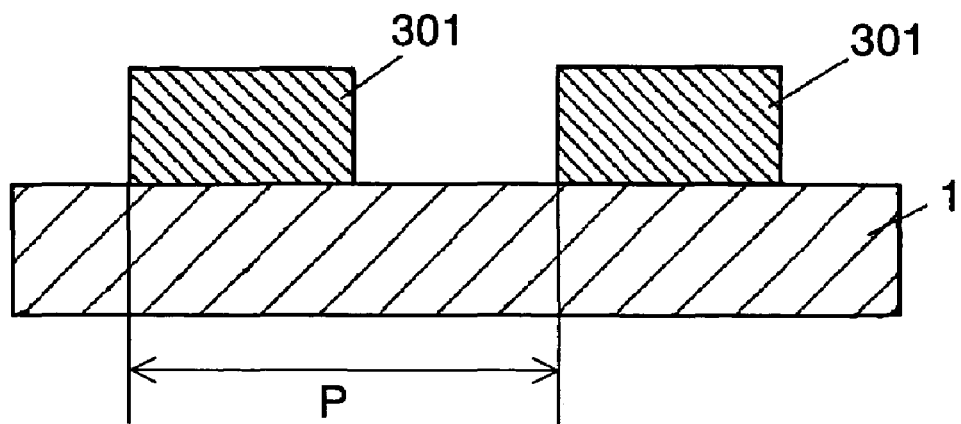
FIG. 1C shows an enlarged sectional view of one cycle of an IDT electrode used in the first embodiment.

FIG. 1A shows a perspective view of a 1-port SAW resonator produced as an example of a SAW device in accordance with the first exemplary embodiment of the present invention. SAW resonator 2 is formed on piezoelectric substrate 1, and SAW resonator 2 is formed of IDT electrode 3 and reflector 4. FIG. 1B shows a sectional view taken along the line t-t of FIG. 1A. FIG. 1C shows an enlarged sectional view of one cycle of the IDT electrode, and the sectional view illustrates that finger-electrodes 301 are formed on substrate 1 at a given pitch "p".

In this embodiment, an LT substrate of 39° Y-cut and on which the SAW propagates along the X-axis (hereinafter referred to as a 39° Y-XLT substrate) is used as piezoelectric substrate 1. A phase velocity "vb" of the slow shear wave that propagates on substrate 1 is 3350.8 m/s. The electrodes of SAW resonator 2 formed on piezoelectric substrate 1 are made of Al—Cu alloy, namely, Cu is added to Al. The electrodes of the SAW resonator include at least an IDT electrode and an electrode of the resonator.

Sample 1 of the first embodiment is SAW resonator 2 of which finger-electrodes 301 have a pitch of 0.8 μm and a normalized film thickness h/λ of 19.4%. This SAW resonator 2 has a resonance frequency f=1891.4 MHz, and the phase velocity thereof calculated using equation (1) is 3026.2 m/s. This speed is slower than the phase velocity vb of the slow shear wave on the 39° Y-XLT substrate used in this embodiment. Based on the foregoing numerical values, the following equation is found: $2 \times p = 1.60 \times 10^{-6}$, $vb/f = 3350.8/(1891.4 \times 10^6) = 1.772 \times 10^{-6}$. Thus, the relation of $2 \times p \leq vb/f$ is satisfied.

A saw resonator as comparison sample 1 has the following specifications: pitch "p" of finger-electrodes 301 is 1.06 μm, and normalized film thickness h/λ is 6.0%. Another SAW resonator as comparison sample 2 has the following specifications: pitch "p" of finger-electrodes 301 is 1.0 μm, and normalized film thickness h/λ is 11%. Those samples have resonance frequencies of 1886.0 MHz (comparison sample 1) and 1884.9 MHz (comparison sample 2). The acoustic velocities of those comparison samples can be found by equation (1) and with their resonance frequencies f, comparison sample 1 has an acoustic velocity of 3998.3 m/s, and comparison sample 2 has an acoustic velocity of 3769.8 m/s. Those velocities are faster than the phase velocity of the slow shear wave propagating on the 39° Y-XLT substrate used in this first embodiment. On top of that, both of those two comparison samples do not satisfy the relation of $2 \times p \leq vb/f$.

Figure 2:
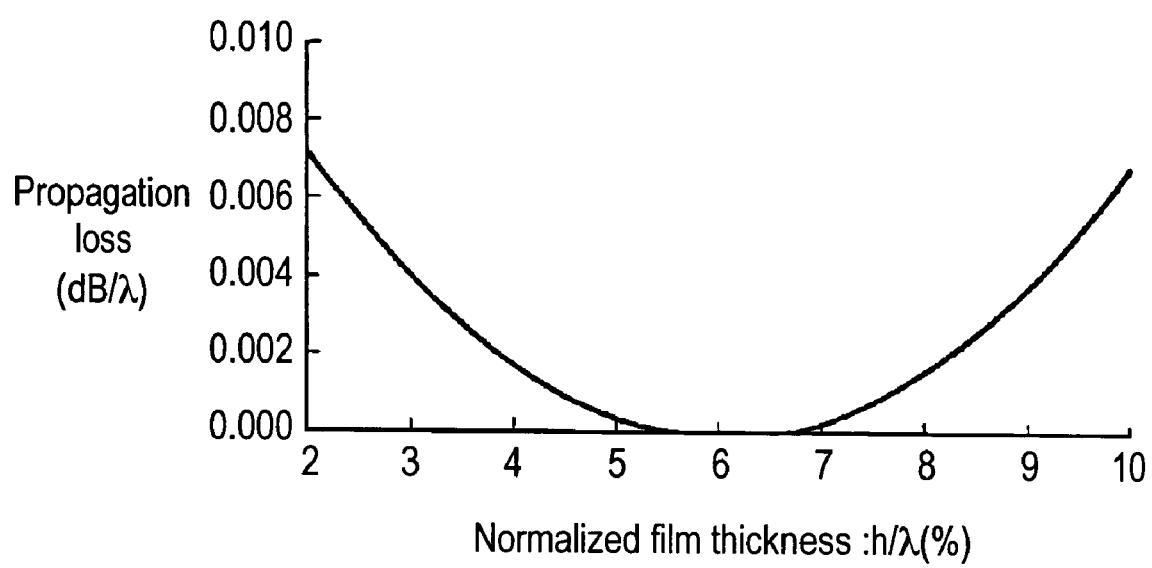
FIG. 2 shows a relation between a propagation loss of a LSAW on a 39° Y-XLT substrate and a normalized film thickness of the IDT electrode.

FIG. 2 shows a relation between a propagation loss of the LSAW on a 39° Y-XLT substrate and a normalized film thickness h/λ of the IDT electrode. As FIG. 2 illustrates, a propagation loss of this LSAW propagating on piezoelectric substrate 1 takes a minimum value when the normalized film thickness h/λ becomes approximately 6%.

Figure 3A:
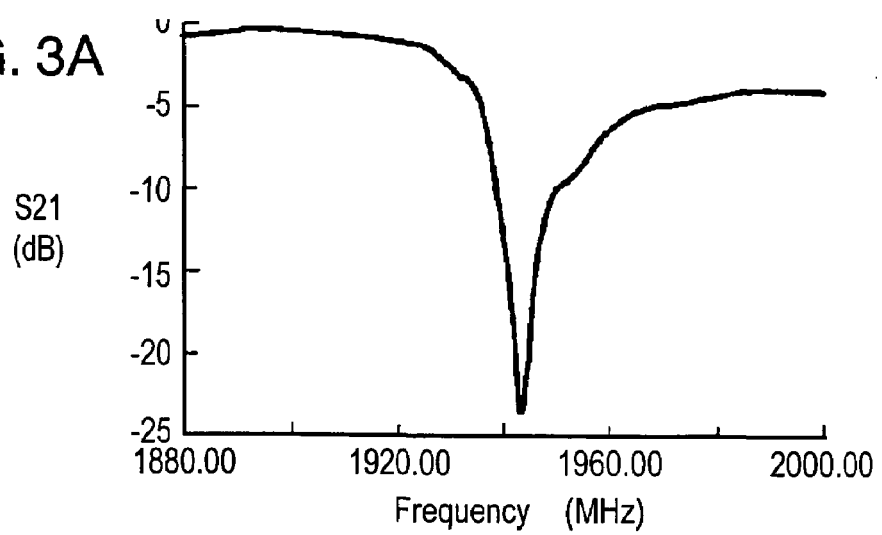
FIG. 3A shows transmission characteristics of the 1-port SAW resonator of sample 1 used in the first embodiment.
Figure 3B:
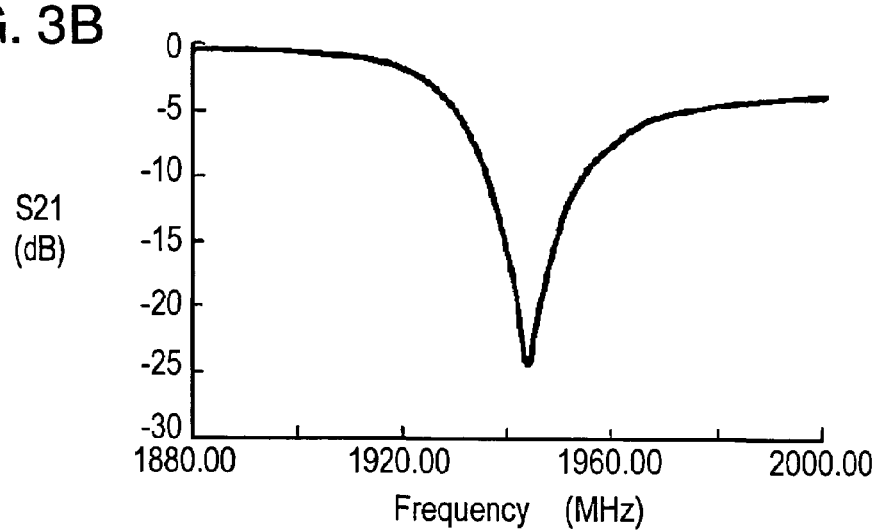
FIG. 3B shows transmission characteristics of a comparison sample 1 with sample 1 of the 1-port SAW resonator used in the first embodiment.
Figure 3C:
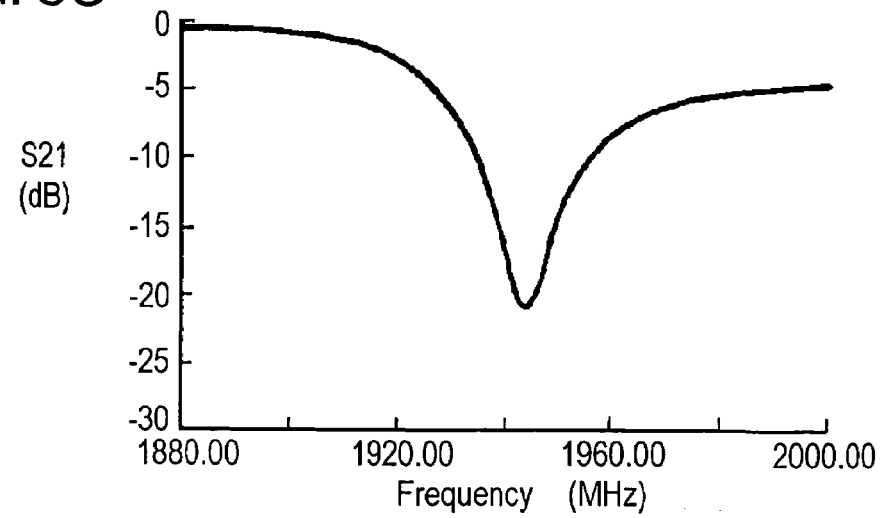
FIG. 3C shows transmission characteristics of a comparison sample 2 with the 1-port SAW resonator in accordance with the first embodiment.

FIG. 3A shows transmission characteristics of SAW resonator 2 of sample 1 used in the first embodiment. FIG. 3B shows transmission characteristics of comparison sample 1, and FIG. 3C shows transmission characteristics of comparison sample 2.

In this embodiment, the SAW resonator is produced in the following way, and its characteristics are evaluated in the following manner Electrode film is formed on piezoelectric substrate 1 by the magnetron-sputtering method, then a given electrode pattern of the SAW resonator is formed by the dry-etching method using the photo-lithography process and chlorine-based etching gas.

Figure 4:
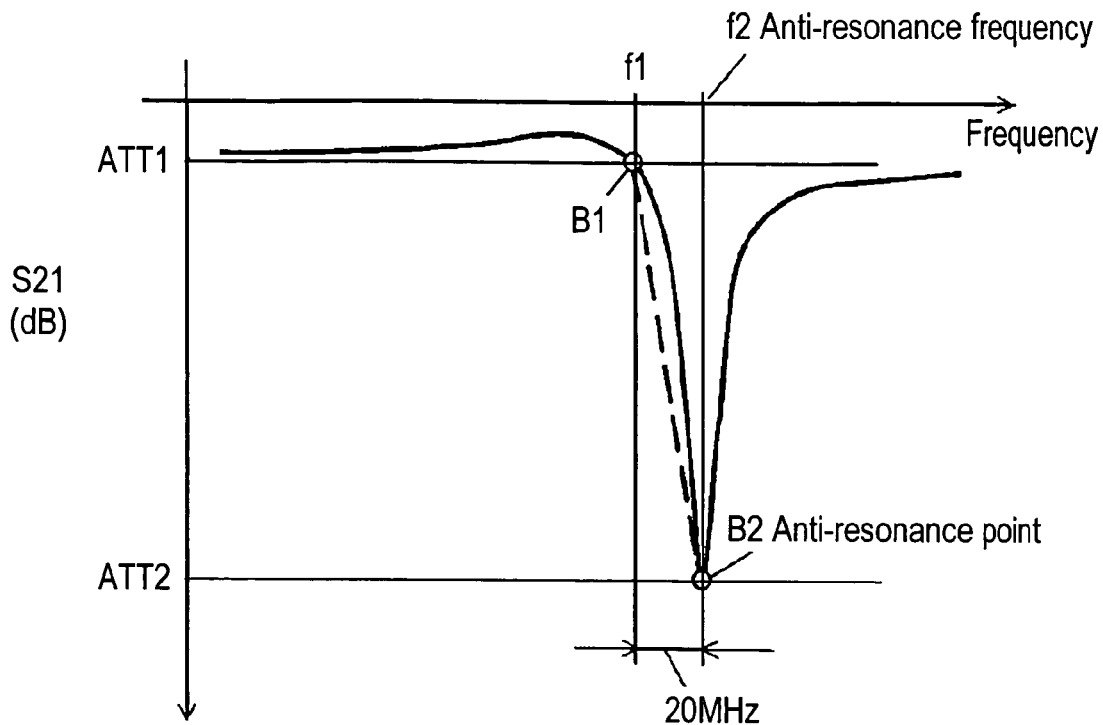
FIG. 4 is used for finding an index of sharpness in the first embodiment.

Electrical characteristics are measured using a RF (Radio Frequency) probe. The steep characteristics, one of the transmission characteristics, are compared by the method illustrated in FIG. 4. To be more specific, as shown in FIG. 4, point B2 of the transmission characteristics is specified as an anti-resonance point, and point B1 is specified at lower side by 20 MHz from anti-resonance frequency f2 corresponding to anti-resonance point B2. A slope of the linear line (the broken line in FIG. 4) connecting B1 to B2 is taken as an index representing the steep characteristics where the index is normalized by a frequency at the middle point between B1 and B2, and f2−f1=20 MHz is found. Thus, the greater the steep characteristics of the resonator, the less insertion loss, and greater attenuation can be expected at the higher index of the steep characteristics. The index can be found by the following equation:

$$\text{Steep Index} = \{(ATT2 - ATT1)/20\}/(f1 + 10)$$

Figure 5:
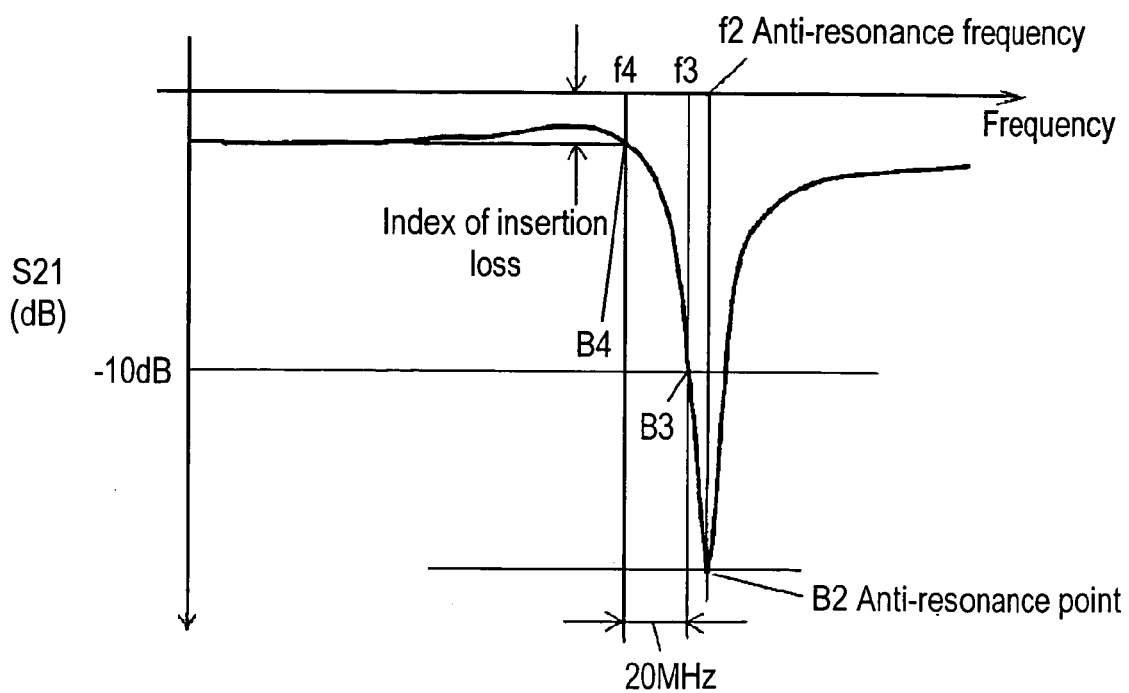
FIG. 5 is used for finding an index of insertion loss in the first embodiment.

An index for comparing insertion loss is evaluated by the method shown in FIG. 5. To be more specific, as shown in FIG. 5, frequency f3 at point B3 where attenuation becomes −10 dB on a lower frequency band side of anti-resonance frequency f2 at anti-resonance point B2 is found. Then frequency f4 at point B4 whose frequency is lower than f3 by 20 MHz is found, and the insertion loss at B4 is taken as an index of insertion loss. As a result, when a ladder filter is produced using the foregoing SAW resonators, the index of insertion loss is obtainable while maintaining a necessary attenuation.

Figure 6:
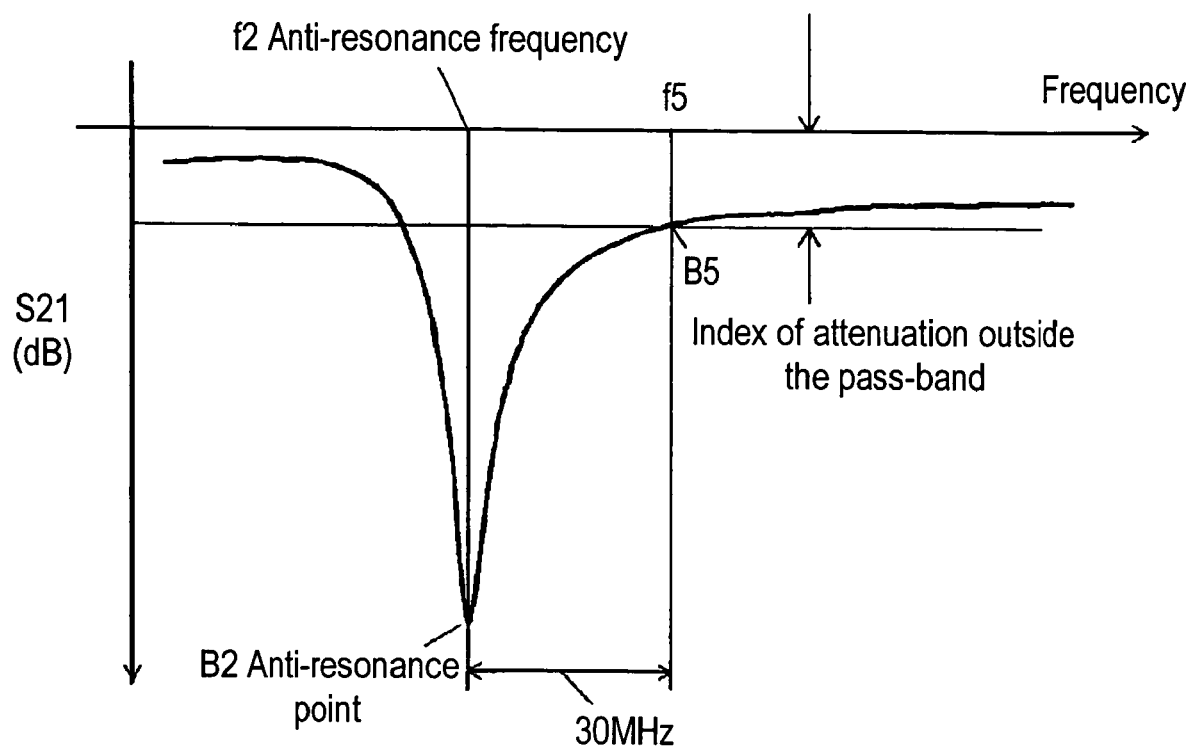
FIG. 6 is used for finding an index of attenuation degree outside the pass-band.

On the other hand, an index of attenuation outside the pass-band is evaluated by a method shown in FIG. 6. Namely, point B5 of which frequency f5 is higher than f2 by 30 MHz is found, and an attenuation degree at f5 is used for comparison.

The foregoing three indexes are used for comparing the characteristics of SAW resonators of sample 1, comparison sample 1, and comparison sample 2. Table 1 shows the results. As discussed above, piezoelectric substrate 1 uses the 39° Y-XLT substrate, and the electrodes are made of Al—Cu alloy.

TABLE 1

| | Pitch between finger electrodes p (μm) | Normalized film thickness H/λ (%) | Resonance frequency f (MHz) | SAW velocity (m/s) |
|---|---|---|---|---|
| Sample 1 | 0.8 | 19.4 | 1891.4 | 3026.2 |
| Comparison sample 1 | 1.06 | 6.0 | 1886.0 | 3998.3 |
| Comparison sample 2 | 1.0 | 11.0 | 1884.9 | 3769.8 |

| | Insertion-loss index (dB) | Steep index | Attenuation index (dB) |
|---|---|---|---|
| Sample 1 | −0.7 | 2184.9 | −4.6 |
| Comparison sample 1 | −1.1 | 2062.5 | −4.8 |
| Comparison sample 2 | −1.9 | 1613.8 | −5.5 |

As table 1 shows, sample 1 has a higher steep-index than comparison sample 1 and comparison sample 2, and a smaller insertion loss, so that sample 1 has better characteristics than the two comparison samples. If the SAW resonator of sample 1 uses the LSAW as the conventional one does, normalized film thickness h/λ is 19.4%, so that the propagation loss is far greater than those of comparison samples 1 and 2 as shown in FIG. 2, and a greater loss is expected. However, the index of insertion loss of sample 1 actually shows a better result than comparison samples 1 and 2. This result tells that the phase velocity of the SAW resonator of sample 1 decreases to be lower than the phase velocity vb of the slow shear wave propagating on the 39° Y-XLT substrate. As a result, the wave, which should have propagated in the LSAW mode, actually propagates in the Rayleigh SAW (RSAW) mode. Thus, propagation loss becomes almost 0 (zero), so that the characteristics of both loss and steep seem to improve. This is because the electrode pitch "p" is set so that the relation of $2 \times p \leq vb/f$ can be satisfied using the foregoing piezoelectric substrate 1.

The steep characteristic is, of course, affected by the reduction of loss, but it can also be affected by a change of the electromagnetic coupling coefficient. In particular, when the film thickness of the electrodes of the SAW resonator is increased, the effective coupling coefficient "keff" increases in general, and as a result, the capacity ratio γ decreases, thereby lowering the sharpness. However, although sample 1 has a thicker film than the comparison samples 1 and 2, it shows a higher sharpness and better characteristics. Thus, the wave which should have propagated in the LSAW mode seems to actually propagate in the RSAW mode, so that the coupling coefficient is lowered simultaneously.

When comparison samples 1 and 2 are compared with each other, comparison sample 1 is better in the insertion loss and the sharpness. This result tells that it seems that the SAWs of both comparison samples 1 and 2 propagate in the conventional LSAW mode, and yet, as shown in FIG. 2, comparison sample 1 uses the normalized film thickness h/λ of approximately 6% at which the propagation loss of the LSAW becomes almost 0 (zero). This result agrees with the disclosure of Japanese Patent Application Non-Examined Publication No. H09-167936. Meanwhile, the acoustic velocities of comparison samples 1 and 2 are faster than that of the slow shear wave propagating on the 39° Y-XLT substrate. Thus, the waves of those two comparison samples are proved to propagate in the conventional LSAW mode.

The foregoing discussion proves the effective method for obtaining the SAW device with low-loss and steep is such that SAW device 2 is formed on piezoelectric substrate 1, which is cut out at the cut angle that allows substrate 1 to excite the LSAW, in such a manner that the relation of $2 \times p \leq vb/f$ can be satisfied.

To be more specific, the electrode made of aluminum or metal comprising mainly aluminum is used, and use piezoelectric substrate 1 comprising LT single-crystal having a cut-face cut out at a rotation angle not less than 26° and not more than 50° from the Y-axis to the Z-axis with respect to the X-axis also used, then various SAW resonators for comparison are produced. The result proves that setting the IDT electrode pattern to satisfy the relation of $2 \times p \leq vb/f$ produces a similar advantage. Further, the metallization ratio η is set at approximately 0.5 and the normalized film thickness h/λ is set not less than 15%. These preparations more positively assure that the SAW device having the foregoing advantages is obtained. As a result, the yield rate can be substantially improved.

In the case of using the electrode made of aluminum or metal comprising mainly aluminum, and using piezoelectric substrate 1 comprising LN single-crystal and having a cut-face cut out at a rotation not less than 50° and not more than 80° from the Y-axis to the Z-axis with respect to the X-axis, various SAW resonators are also produced for comparison. The result proves that setting the IDT electrode pattern to satisfy the relation of $2 \times p \leq vb/f$ produces a similar advantage. Further, the metallization ratio η is set at approximately 0.5 and the normalized film thickness h/λ is set not less than 12%. These preparations more positively assure that the SAW device having the foregoing advantages is obtained. As a result, the yield rate can be substantially improved.

The present invention is not limited to the foregoing discussion. For instance, the electrode can use materials other than aluminum or metal mainly comprising aluminum. The piezoelectric substrate can use the LT single-crystal or LN single-crystal cut out at another cut-angle, or it can use a substrate made of $LiB_2O_3$ (LBO), other materials for piezoelectric substrate or piezoelectric thin-film. In such a case, the phase velocity of the SAW, which should have propagated as the LSAW, can be reduced to be lower than the speed of the slow shear wave by using various means, so that the SAW can propagate as the RSAW. At the same time, the film thickness and the shape of IDT electrode are set to satisfy the foregoing relation. Then, a similar advantage to what is discussed above is achievable.

Exemplary Embodiment 2

Figure 7A:
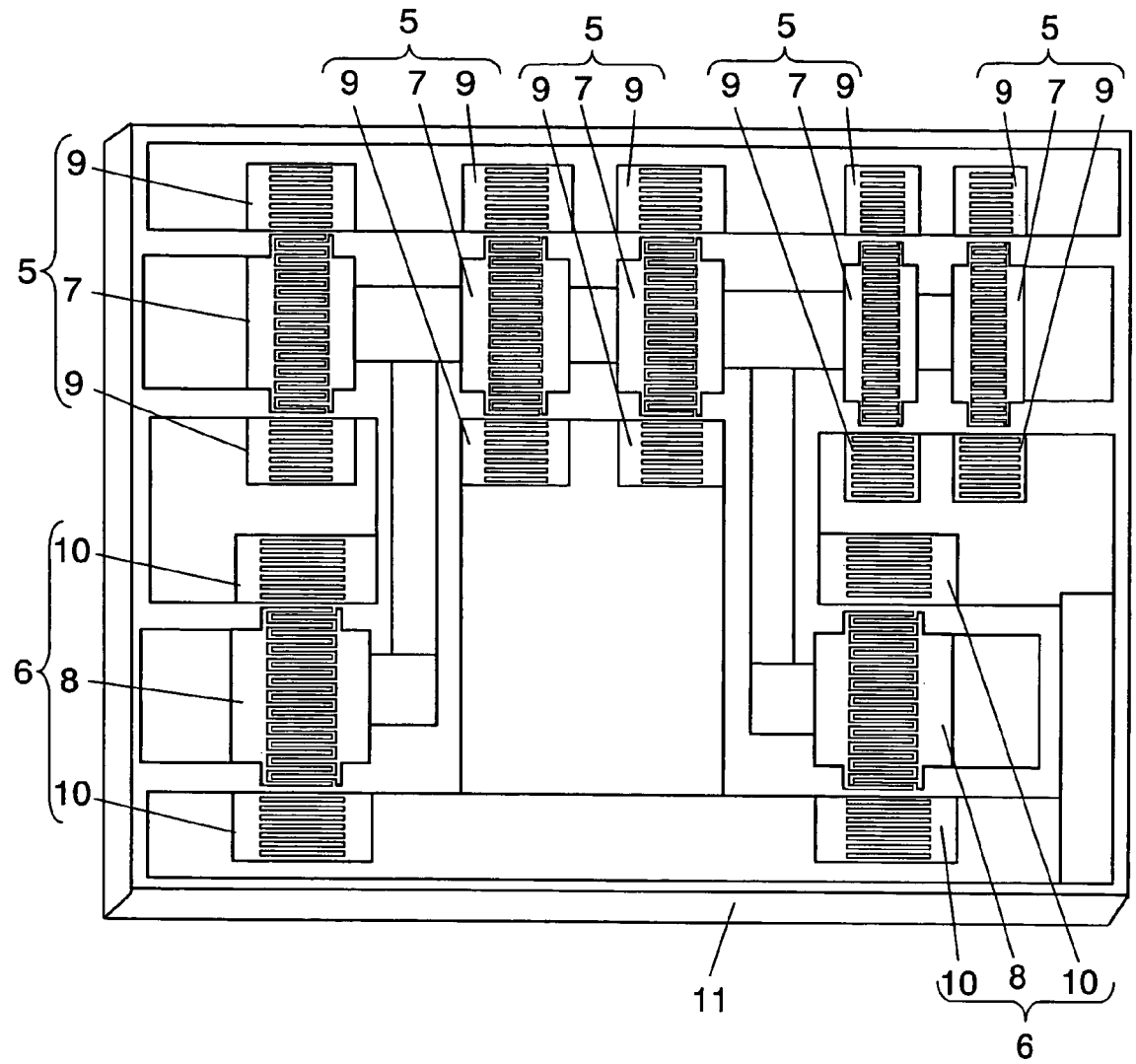
FIG. 7A shows a perspective view illustrating a structure of a ladder SAW filter in accordance with a second exemplary embodiment of the present invention.
Figure 7B:
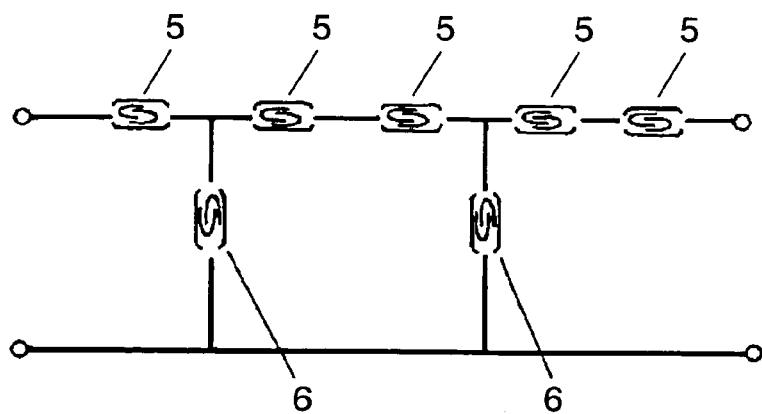
FIG. 7B shows a circuit diagram of the ladder SAW filter in accordance with the second embodiment.

A ladder SAW filter is produced as an example of the SAW device in accordance with the second exemplary embodiment of the present invention. FIG. 7A shows a perspective view illustrating a structure of this SAW filter. FIG. 7B shows a circuit diagram of this SAW filter. As FIG. 7B illustrates, the SAW filter comprises five SAW resonators 5 coupled in series, and two SAW resonators 6 coupled in parallel. Resonators 5 in series comprise IDT electrodes 7 and reflectors 9 disposed on both sides of electrodes 7. On the other hand, resonators 6 comprise IDT electrodes 8 and reflectors 10 disposed on both sides of electrodes 8. The film thickness and the pattern of the respective electrodes are set such that the center frequency becomes 836 MHz and the bandwidth becomes 25 MHz.

Figure 8:
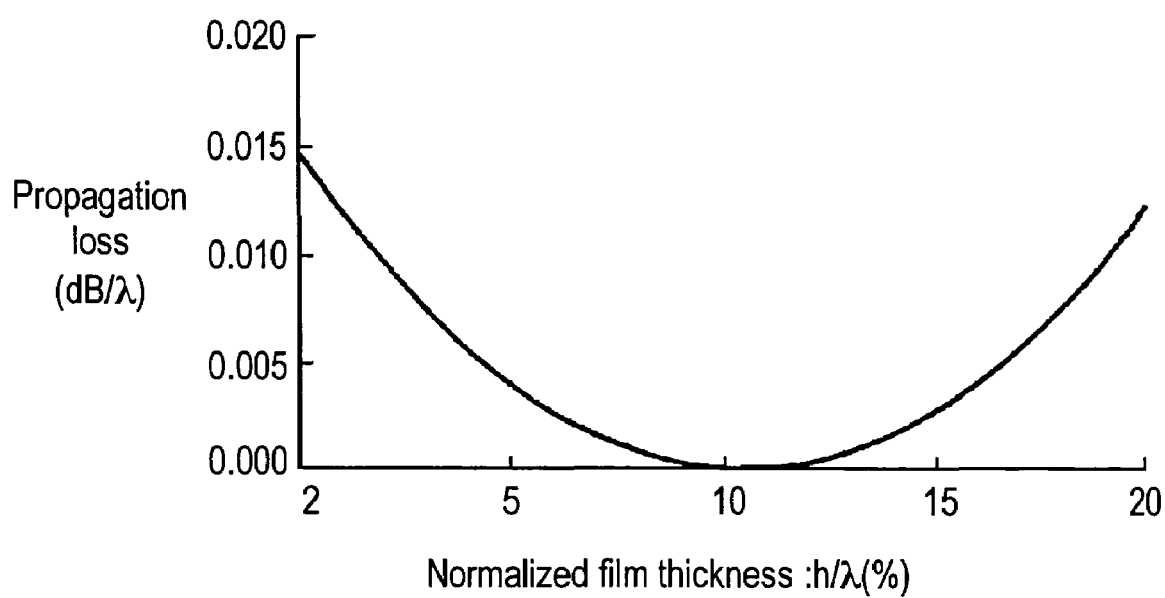
FIG. 8 shows a relation between a propagation loss of a LSAW on a LT42° substrate and a normalized film thickness of the IDT electrode.

In this embodiment, a LT substrate of 42° Y-cut and X-propagation (hereinafter referred to as a LT42° substrate) is used as piezoelectric substrate 11. A slow shear wave propagating on this substrate 11 has a phase velocity vb of 3350.8 m/s. FIG. 8 shows a relation between the normalized film thickness "h/λ" and a propagation loss of the SAW resonator that uses the LSAW and is formed of piezoelectric substrate 11. The electrodes of the SAW resonator are made of Al—Cu alloy film where Cu is added to Al. A method of producing this SAW filter and a method of evaluating the electrical characteristics are similar to those in the first embodiment.

Figure 9A:
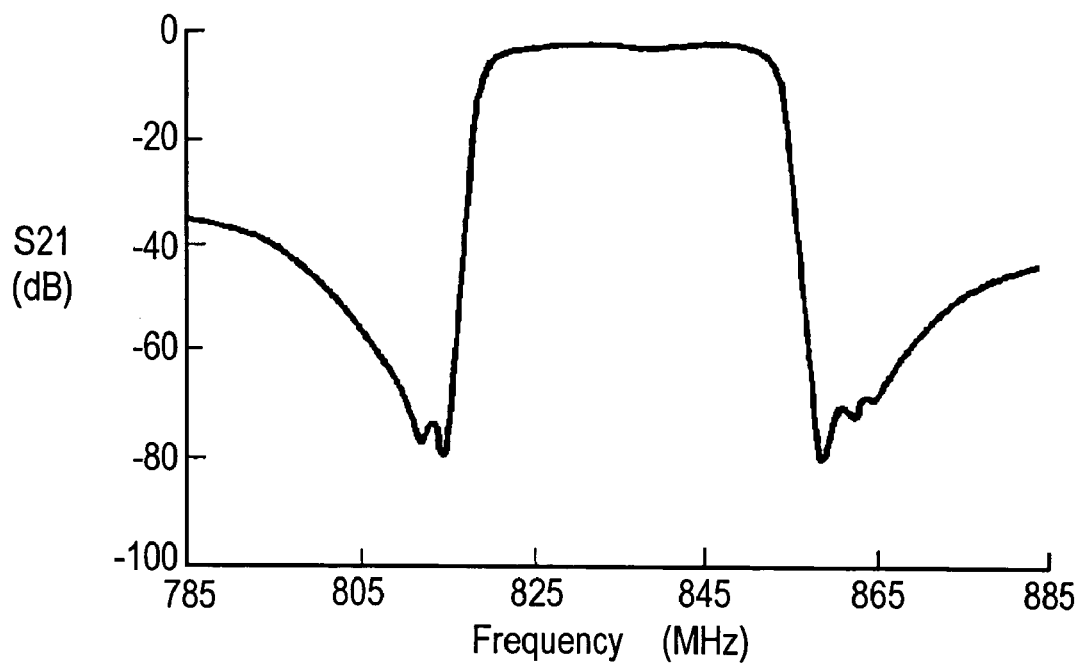
FIG. 9A shows transmission characteristics of sample 2 of the ladder SAW filter in the second embodiment.
Figure 9B:
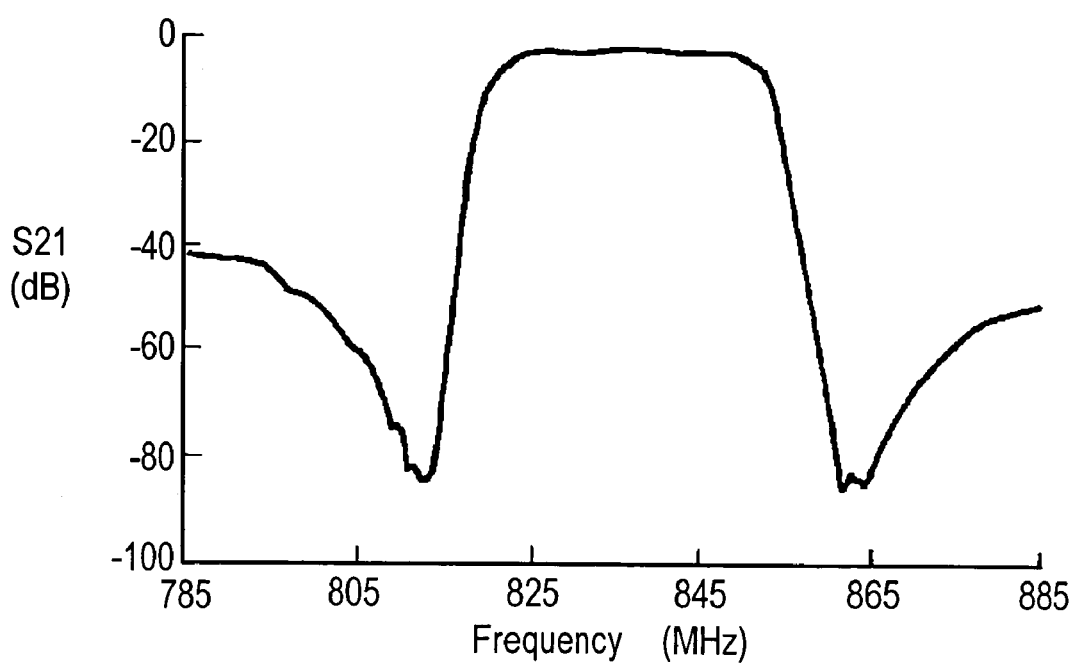
FIG. 9B shows transmission characteristics of comparison sample 3 with the ladder SAW filter in accordance with the second embodiment.

Table 2 shows the comparison between sample 2 and comparison sample 3 with respect to the following points: pitch "p" of finger-electrodes of IDT electrodes of both resonators 5 in series and resonators 6 in parallel; normalized film thickness "h/λ"; resonance frequency "f"; and SAW phase velocity. Table 2 shows that sample 2 satisfies the relation of 2×p≦vb/f. However, comparison sample 3 does not satisfy this relation. FIG. 9A shows the transmission characteristics of the SAW filter of sample 2, and FIG. 9B shows that of the SAW filter of comparison sample 3.

Figure 10:
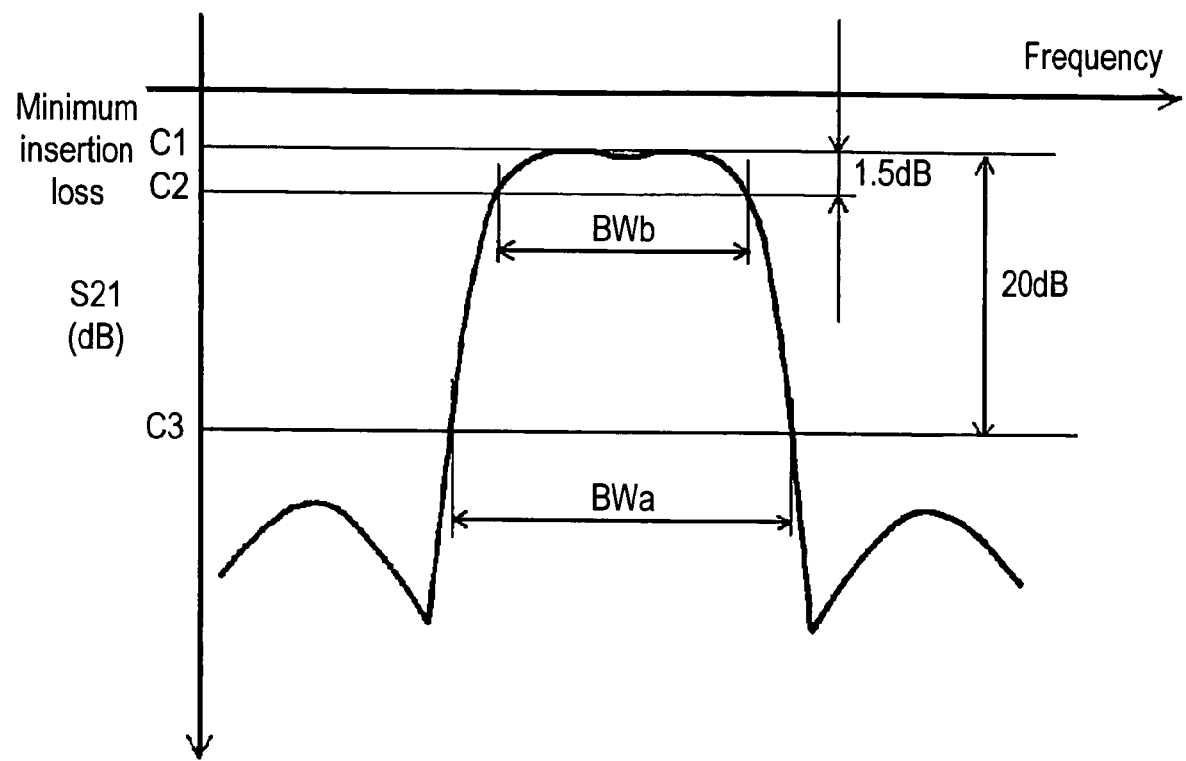
FIG. 10 illustrates a definition of shape factor in the second embodiment.

The indexes for evaluating respective transmission characteristics use the minimum insertion loss and a shape-factor of the filters. The shape factor is defined in the same way as disclosed in Japanese Patent Application Non-Examined Publication No. H09-167936. FIG. 10 describes the definition of the shape factor, to be more specific, the shape factor is defined by finding bandwidth BWb at point C2 where a signal is further attenuated by 1.5 dB from the minimum insertion-loss point C1 of the pass-band, finding bandwidth BWa at point C3 where the signal is further attenuated by 20 dB from point C1, and finding a ratio of the two as the shape factor, i.e., BWa/BWb. The characteristics of the filter becomes broader, a selection ratio degrades, and a pass-band becomes narrower at a higher shape factor. Thus, the shape factor becomes closer to 1 (one), and a pass-band filter becomes more sophisticated.

TABLE 2

| Resonator | | Pitch between finger electrodes p (μm) | Normalized film thickness h/λ (%) | Resonance frequency f (MHz) |
|---|---|---|---|---|
| samples 2 | (series arm) SAW resonators 5 | 1.81 | 19.3 | 835.9 |
| | (parallel arm) SAW resonators 6 | 1.86 | 18.4 | 813.5 |
| Comparison sample 3 | (series arm) SAW resonators 5 | 2.4 | 9.9 | 836.3 |
| | (parallel arm) SAW resonators 6 | 2.47 | 10.1 | 811.4 |

| Resonator | | SAW velocity (m/s) | Minimum. insertion loss (dB) | shape factor (dB) |
|---|---|---|---|---|
| samples 2 | (series arm) SAW resonators 5 | 3026.0 | −2.1 | 1.4 |
| | (parallel arm) SAW resonators 6 | 3026.2 | | |
| Comparison sample 3 | (series arm) SAW resonators 5 | 4014.2 | −2.8 | 1.5 |
| | (parallel arm) SAW resonators 6 | 4008.3 | | |

Table 2 shows the measurements of the minimum insertion loss and the shape factor of sample 2 and comparison sample 3. As table 2 shows, sample 2 obtains better results concerning the minimum insertion loss and the shape factor than comparison sample 3. The normalized film thickness h/λ of the SAW resonators of comparison sample 3 show values, as shown in FIG. 8, which make the propagation loss of the LSAW on the LT 42° substrate close to 0 (zero). On the other hand, the normalized film thickness h/λ of the SAW resonators of sample 2 are 18.4% and 19.3%. Therefore, if the respective SAW resonators forming this SAW filter operate using the LSAW, the resonators incur greater propagation loss, as FIG. 8 shows. The minimum insertion loss and the shape factor should have become worse than those of comparison sample 3. However, since the IDT electrodes are formed such that the respective SAW resonators satisfy the relation of 2×p≦vb/f, sample 2 can achieve a more sophisticated SAW filter than comparison sample 3.

In this second embodiment, a ladder SAW filter is used. However, the present invention is not limited to this filter. For instance, use of other resonating SAW filters, such as a lattice SAW filter, a multi-mode SAW filter, or IIDT (inter-digitated interdigital transducer) SAW filter, also produce a similar advantage as far as they satisfy the relation of 2×p≦vb/f.

The present invention achieves novel filter characteristics which the prior art cannot obtain, so that a compact, light-weight and sophisticated filter is obtainable. Use of this novel filter allows mobile communication apparatuses to be downsized and lighter.

Exemplary Embodiment 3

In this third embodiment, a 1-port SAW resonator similar to that used in the first embodiment is used as a SAW device.

Samples 3–6 employ a LT 36° substrate as piezoelectric substrate 1, and a slow shear wave propagates on this LT 36° substrate at a phase velocity vb of 3350.8 m/s. Comparison sample 4 employs a LT 42° substrate as piezoelectric substrate 1. SAW resonators, of which structures are shown in FIG. 1A through FIG. 1C, are formed on those piezoelectric substrates 1.

The SAW resonators of samples 3–5 have the following specifications: pitch "p" of finger-electrodes=0.8 μm, metallization ratio η=ca. 0.5; and resonance frequency "f"=1890.6 MHz. Sample 6 has the following specification: "p"=0.6 μm; η=ca. 0.5; and "f"=1890.6 MHz.

Figure 1D:
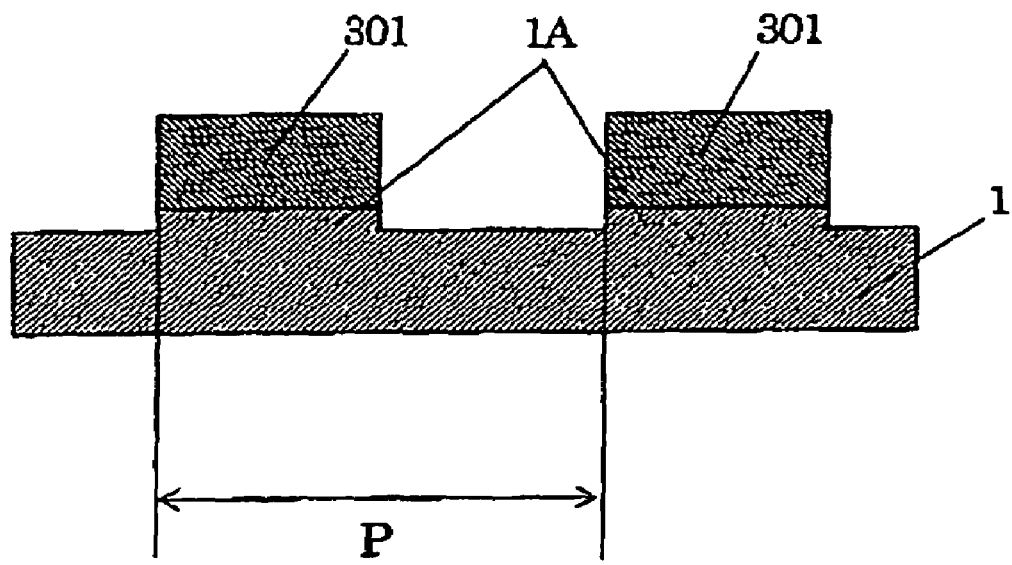
FIG. 1D shows a schematic illustration of sample 4.

Samples 3 and 4 employ aluminum (Al) as the material of the electrodes of SAW resonators, and sample 3 has a normalized film thickness h/λ=19.8% while sample 4 uses a thinner film of which h/λ is 15.0%. However, as shown in FIG. 1D, sample 4 is equipped with a step 1A, on which electrodes 301 are formed, on the LT substrate so that its resonance frequency agrees with that of sample 3. The way of forming the electrodes on the step is detailed later.

Sample 5 employs electrodes made of tungsten (W) which has a higher density than Al, and has a normalized film thickness h/λ of 2.7% because the difference in density is taken into account. Those preparations allow sample 5 to have the same resonance frequency as sample 3.

Figure 1E:
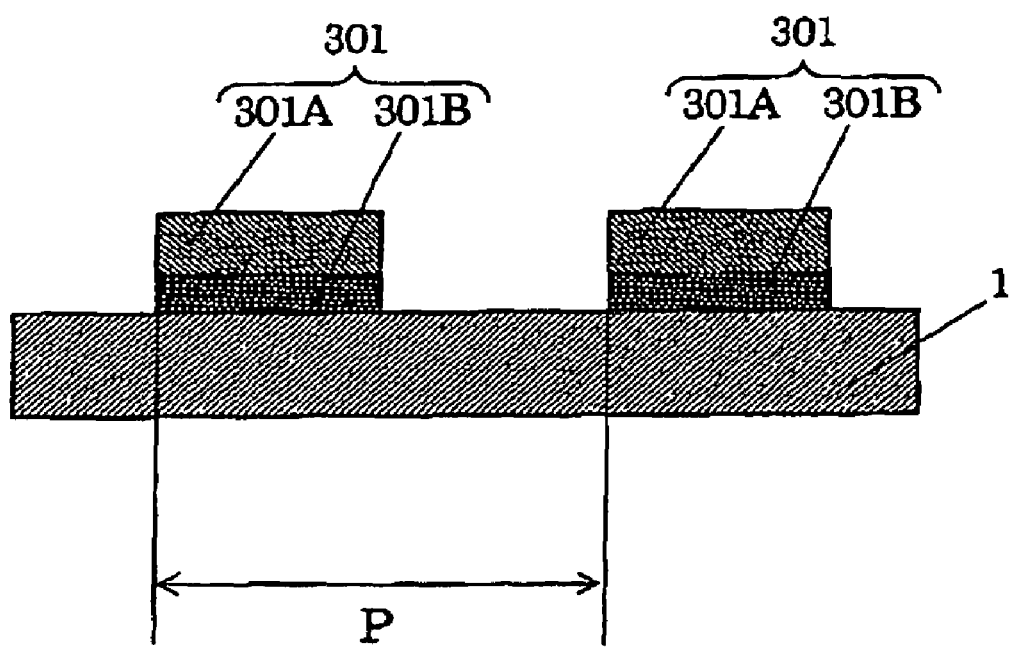
FIG. 1E shows a schematic illustration of sample 6.

As shown in FIG. 1E. sample 6 employs multi-layered film electrodes 301 formed of a W-layer 301B and a Al-layer 301A as the electrodes of the SAW resonator, and has a normalized film thickness h/λ of 8.7%. The resonance frequency of sample 6 is set the same as that of sample 3 because a thickness ratio of the Al-layer versus the W-layer, and the difference in density of Al and W are taken into account. Those preparations allow the respective normalized film thickness h/λ of samples 4–6 to agree with that of sample 3 if they are converted into the case where Al is used.

The SAW resonator of comparison sample 4 is produced, and has the following specifications: "p"=1.1 μm; η=ca. 0.5; and "h/λ"=ca. 10%. These specifications can minimize the insertion loss of the LSAW in the case of using the LT 42° substrate.

Samples 4–6 have the same resonance frequency "f", i.e., 1890.6 MHz. The SAW resonators are produced and evaluated basically in the same way as those in the first embodiment. However, since sample 4 needs to form the step on the piezoelectric substrate, sputter-etching where Ar is added to chlorine-based etching gas is carried out in the process of etching electrode-patterns of the IDT electrodes and resonator's electrodes. This sputter-etching etches exposed areas of the piezoelectric substrate, namely, partial spaces between the finger-electrodes, so that the step is formed. As a result, the IDT finger-electrodes are formed in a given thickness on a top of the step having the same pitch as the IDT finger-electrodes.

In the case of samples 5 and 6, fluorine-based gas is used for etching the tungsten (W). Sample 6, in particular, uses chlorine-based gas for etching the Al-layer, and uses fluorine-based gas for etching the W-layer by using the Al-layer as an etching mask.

The transmission characteristics of the SAW resonators of samples 3–6 and comparison sample 4 are shown in FIG. 11A-FIG. 11E, respectively. Table 3 shows the characteristics measured of the respective SAW resonators.

Figure 11A:
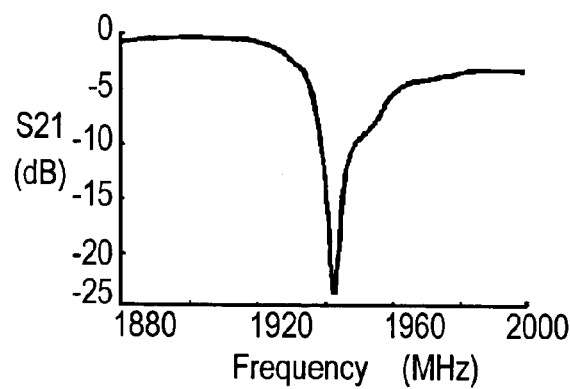
FIG. 11A shows transmission characteristics of sample 3 of a 1-port SAW resonator used in the third embodiment.
Figure 11D:
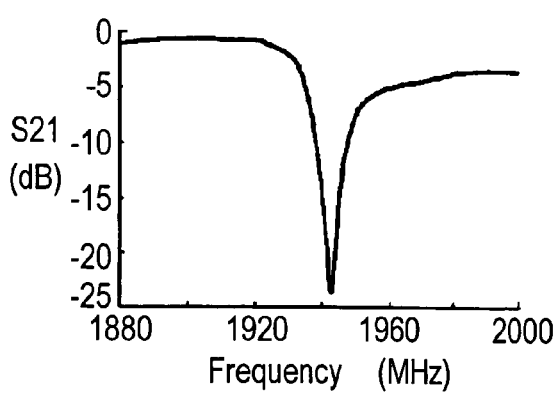
FIG. 11D shows transmission characteristics of sample 6 of the 1-port SAW resonator used in the third embodiment.
Figure 11B:
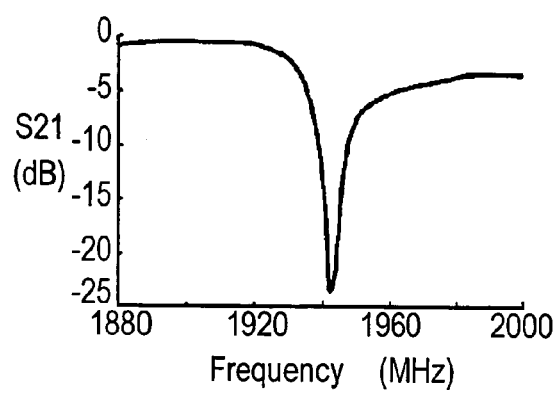
FIG. 11B shows transmission characteristics of sample 4 of the 1-port SAW resonator used in the third embodiment.
Figure 11E:
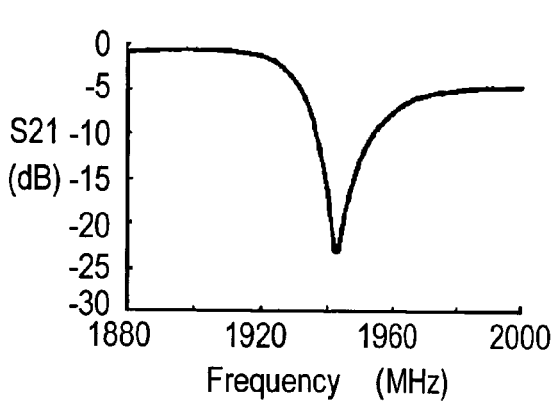
FIG. 11E shows transmission characteristics of comparison sample 4 with the 1-port SAW resonator in accordance with the third embodiment.
Figure 11C:
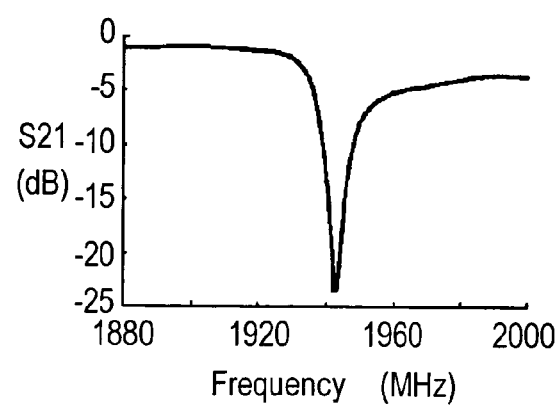
FIG. 11C shows transmission characteristics of sample 5 of the 1-port SAW resonator used in the third embodiment.

The comparison of FIG. 11A-FIG. 11D of samples 3–6 with FIG. 11E of comparison sample 4 proves that samples 3–6 have better steep characteristics than comparison sample 4. Samples 3, 4, ad 6 have less insertion-loss than comparison sample 4. To be more specific, the three samples have better numerical values concerning the minimum insertion-loss and the index of insertion-loss than comparison sample 4. Sample 5, on the other hand, has rather inferior numerical values compared to comparison sample 4 because the use of W in the IDT electrodes is obliged to reduce the film thickness, and W, per se, has a greater specific resistance than Al, so that the resistance of the IDT electrodes becomes greater.

TABLE 3

| | Piezoelectric substrate | Pitch between finger electrodes p (μm) | Normalized film thickness h/λ (%) | Resonance frequency f (MHz) |
|---|---|---|---|---|
| Sample 3 | 36° LT substrate | 0.8 | 19.8 | 1890.6 |
| Sample 4 | 36° LT substrate | 0.8 | 15.0 | 1890.6 |
| Sample 5 | 36° LT substrate | 0.8 | 2.7 | 1890.6 |
| Sample 6 | 36° LT substrate | 0.6 | 8.7 | 1890.6 |
| comparison sample 4 | 42° LT substrate | 1.1 | 10.0 | 1884.8 |

| | Piezoelectric substrate | SAW velocity (m/s) | Insertion-loss index (dB) | Sharpness index |
|---|---|---|---|---|
| Sample 3 | 36° LT substrate | 3025.0 | −0.7 | 2202.4 |
| Sample 4 | 36° LT substrate | 3025.0 | −0.7 | 2202.4 |
| Sample 5 | 36° LT substrate | 3025.0 | −1.2 | 2202.4 |
| Sample 6 | 36° LT substrate | 2268.7 | −0.3 | 2208.3 |
| comparison sample 4 | 42° LT substrate | 4146.6 | −0.8 | 2089.2 |

Meanwhile, comparison sample 4 satisfies the specifications that can conventionally obtain a rather excellent SAW resonator, including: a cut-angle of LT substrate=42°; and a normalized film thickness of electrode h/λ=ca. 10%. Samples 3–6, on the other hand, form the SAW resonators on the piezoelectric substrate cut out at an angle that allows the substrate to excite a LSAW so that the relation of 2×p≦vb/f can be satisfied. The third embodiment thus proves that the SAW resonator having lower loss and similar or better steep characteristics than comparison sample 4 is obtainable with no substantial limits to a cut-angle of the substrate.

Comparison sample 4 is a SAW device having finger-electrodes made of Al and using the LSAW. Film thickness "hL" of its IDT electrodes of comparison sample 4 is 0.11 μm. Samples 3 and 4 also have the finger-electrodes of IDT electrodes made of Al, and approximately the same resonance frequency as that of comparison sample 4. However, samples 3 and 4 are SAW devices using the slow shear wave, and have film thicknesses "hL" of 0.32 μm and 0.24 μm, respectively. Based on those results and measurements of other samples, it can be concluded that the structure satisfying hL≦hr allows a SAW resonator of low loss and excellent steep characteristics without selecting a certain cut-angle to be obtained. This is because the phase velocity of the SAW can be slower, due to the mass-load effect, than that of the slow shear wave propagating on the piezoelectric substrate.

The comparison of transmission characteristics between samples 3–6 shown in FIG. 11A-FIG. 11D results in the following facts, Sample 3 shows some wavy characteristics, while samples 4–6 do not show such wavy phenomena.

Sample 3 makes a phase velocity of the wave, which should have propagated as the LSAW, slower than that of the slow shear wave and uses the wave as the RSAW, so that the reflection coefficient per electrode (IDT electrodes and reflector's electrodes) is reduced. To overcome this problem, reconsidering the design is one possibility. However, it is necessary to improve the reflectance per electrode.

The comparison also finds the following facts about samples 4–6. Sample 4 shows smooth transmission characteristics because the step is provided. Samples 5 and 6 also show smooth transmission characteristics because entire or partial electrodes are made of W having a density higher than Al. Those facts tell that use of a step formed on a substrate, or use of electrodes entirely or partially made of material having a higher density than aluminum is effective for improving the lowering of reflectance per electrode. This lowering of reflectance is caused by the use of the wave as the RSAW instead of the LSAW by making the phase velocity slower than the slow shear wave.

In this third embodiment, formation of a step on a piezoelectric substrate or use of material having a density higher than aluminum improves reflectance of the IDT electrodes and reflector's electrodes. There are other methods to improve the lowering of reflectance, e.g., formation of an insulator between the IDT electrodes and the piezoelectric substrate, to the extent that the electrical characteristics do not decrease lower.

In this embodiment, tungsten (W) is selected as the material of higher density than aluminum. However, the material of electrode is not limited to W, and other metals, such as Ta, Mo, Ti and Cu, or an alloy of those metals or multi-layered film, can be used. In the case of using the multi-layered film, it is not limited to the lamination structure or lamination materials discussed in this embodiment, but can use various lamination structures satisfying the condition of the present invention. The IDT electrodes and reflector's electrodes are not necessarily made of the same material, and do not always have the same structure.

At the same time, an increase of a reflection coefficient of a bus-bar section forming both ends of a SAW wave-guide area can reduce the leakage from the wave-guide area, and improve the resonator's characteristics. However, it is preferable to moderately boost the resistance value of IDT electrodes in comparison with the case of using aluminum in the electrodes. To be more specific, the resistance value is preferably not more than 10 times of the resistance value in the case of using aluminum. If the IDT electrodes have rather high resistance, the material or the structure of the bus-bar other than IDT electrodes or wires routed is changed, thereby lowering the resistance of that section. This method is particularly effective when the SAW filter using the resonator discussed in this third embodiment is formed.

Use of electrode material, such as W or Mo, having a smaller coefficient of linear thermal expansion than the substrate material, or use of the laminated electrode using the foregoing electrode materials can improve not only the reflectance, but also temperature characteristics. On top of that, the present invention allows the film thickness of the electrodes to be thicker than that of the conventional SAW, thus greater effects can be expected.

Exemplary Embodiment 4

The fourth embodiment uses a 1-port SAW resonator similar to the one used in the first embodiment. Samples 7 and 8 for this fourth embodiment use Al as the material of IDT electrodes 3 and reflector's electrodes 4 are both formed on piezoelectric substrate 1 which employs the LT 36° substrate. The slow shear wave propagates on substrate 1 at a phase velocity vb of 3350.8 m/s.

Figure 12A:
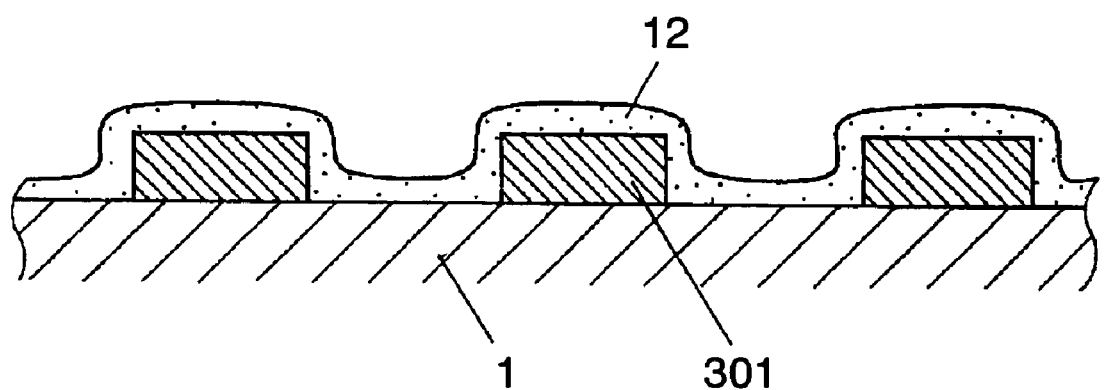
FIG. 12A shows a sectional view illustrating parts of a 1-port SAW resonator of sample 7 in accordance with the fourth exemplary embodiment of the present invention.
Figure 12B:
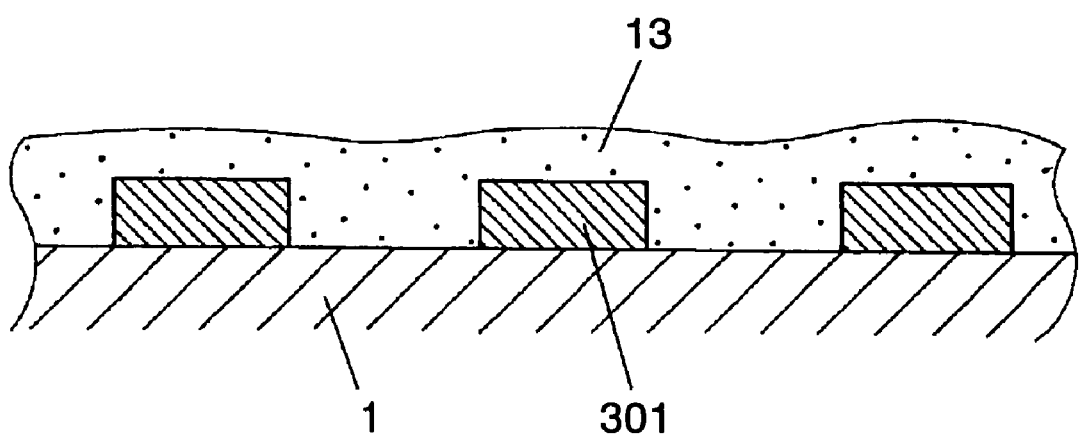
FIG. 12B shows a sectional view illustrating parts of the 1-port SAW resonator of sample 7 in accordance with the fourth embodiment.

Samples 7 and 8, as shown in FIGS. 12A and 12B, have dielectric film for covering IDT electrodes and reflectors of the SAW resonators.

Sample 7 uses silicon-nitride film 12 as this dielectric film. FIG. 12A shows the sectional view of this structure, where finger-electrodes 301 of the IDT electrodes are formed on piezoelectric substrate 1, and silicon-nitride film 12 is formed as the dielectric film over finger-electrodes 301 and substrate 1.

Sample 8 uses silicon-oxide film 13 as the dielectric film. FIG. 12B shows the sectional view of this structure, where finger-electrodes 301 of the IDT electrodes are formed on piezoelectric substrate 1, and similar to the structure shown in FIG. 12A, silicon-oxide film 13 is formed as the dielectric film over electrodes 301 and substrate 1. Characteristics of the respective SAW resonators are shown in Table 4.

Sample 7 has the following specifications: pitch "p" of finger-electrodes=0.80 μm; metallization ratio η=ca. 0.5; resonance frequency before silicon-nitride film 12 is formed "$f_{before}$"=1885.45 MHz; and resonance frequency after film 12 is formed "$f_{after}$"=1876.30 MHz. In sample 7, the phase velocity of the SAW before film 12 is formed is 3016.7 m/s, which is slower than that of the slow shear wave. Thus, the relation of $2 \times p \leq vb/f$ before can be satisfied. Further, the phase velocity of the SAW after film 12 is formed is 3002.1 m/s, which is also slower than that (3350.8 m/s) of the slow shear wave. Then, the relation of $2 \times p \leq vb/f_{after}$ can be satisfied. In other words, sample 7 satisfies the relation of $2 \times p \leq vb/f$ both before and after film 12 is formed.

Sample 8 has the following specification: "p"=0.80 μm; η=ca. 0.5; resonance frequency before silicon-oxide film 13 is formed "$f_{before}$"=1848.37 MHz; and resonance frequency after film 13 is formed "$f_{after}$"=2484.20 MHz. In sample 8, the phase velocity of the SAW before film 13 is formed is 2957.4 m/s, which is slower than that of the slow shear wave. Thus, the relation of $2 \times p \leq b/f_{before}$ can be satisfied. Further, the phase velocity of the SAW after film 13 is formed is 3974.7 m/s, which is faster than that (3350.8 m/s) of the slow shear wave. Then, the relation of $2 \times p \leq vb/f_{after}$ can be satisfied. In other words, sample 8 satisfies the relation of $2 \times p \times f_{before} \leq vb \leq 2 \times p \times f_{after}$ both before and after film 13 is formed.

Comparison samples 5 and 6 are produced to use SAW resonators employing regular LSAWs of which resonance frequencies are equal to $f_{after}$ of samples 7 and 8, respectively. Both comparison samples 5 and 6 employ electrodes made of Al in the SAW resonators, and use a 36° Y-cut and X-propagation LT substrate as the piezoelectric substrate. Comparison sample 5 has pitch "p" of electrodes=1.06 μm, and metallization ratio η=ca. 0.5, and comparison sample 6 has pitch "p" of electrodes=0.81 μm, and metallization ratio η=ca. 0.5. According to equation (1), the acoustic velocities of the LSAW of comparison samples 5 and 6 are thus calculated as 4001.3 m/s, and 4004.3 m/s respectively. They are faster than that of the slow shear wave.

Figure 13A:
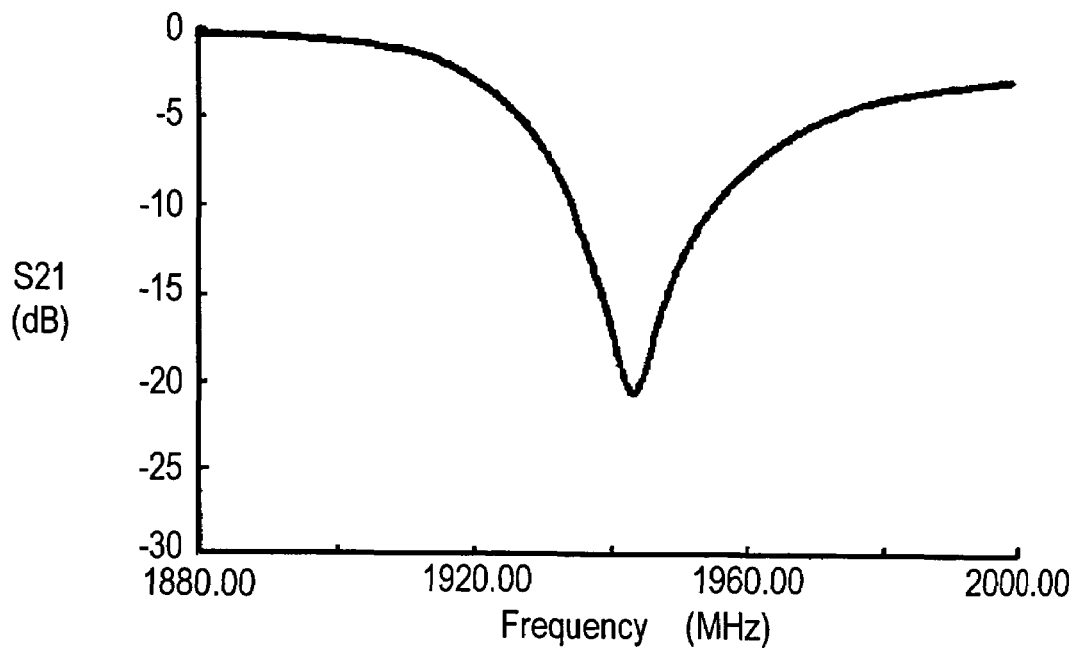
FIG. 13A shows transmission characteristics before dielectric film is formed in the 1-port SAW resonator of sample 7 in the fourth embodiment.
Figure 13B:
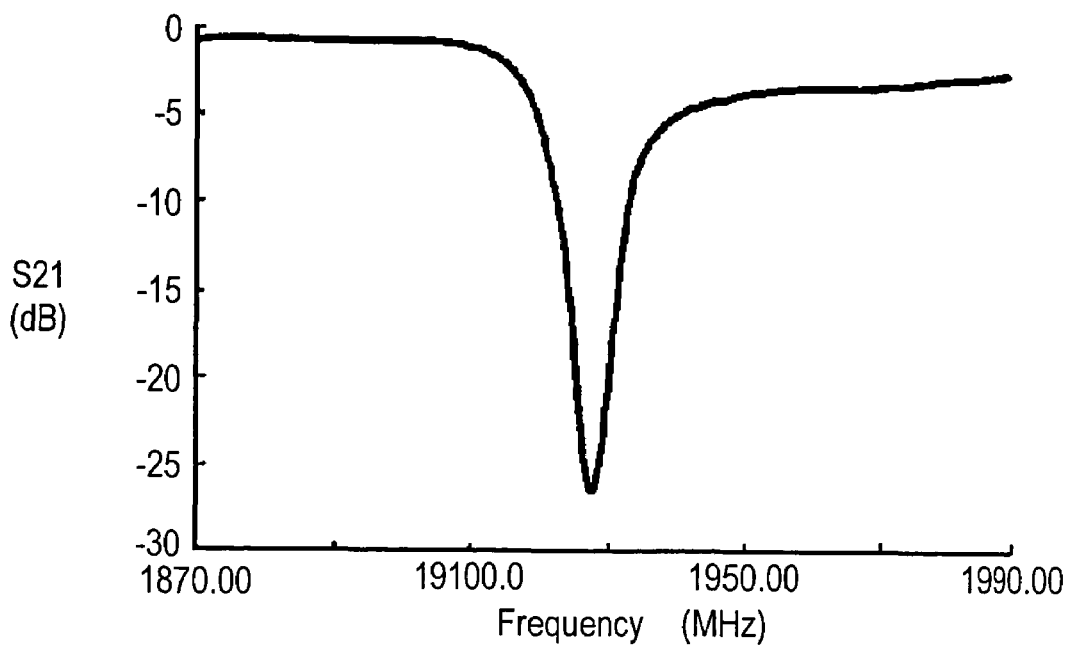
FIG. 13B shows transmission characteristics after the dielectric film is formed in the 1-port SAW resonator of sample 7 in the fourth embodiment.
Figure 14A:
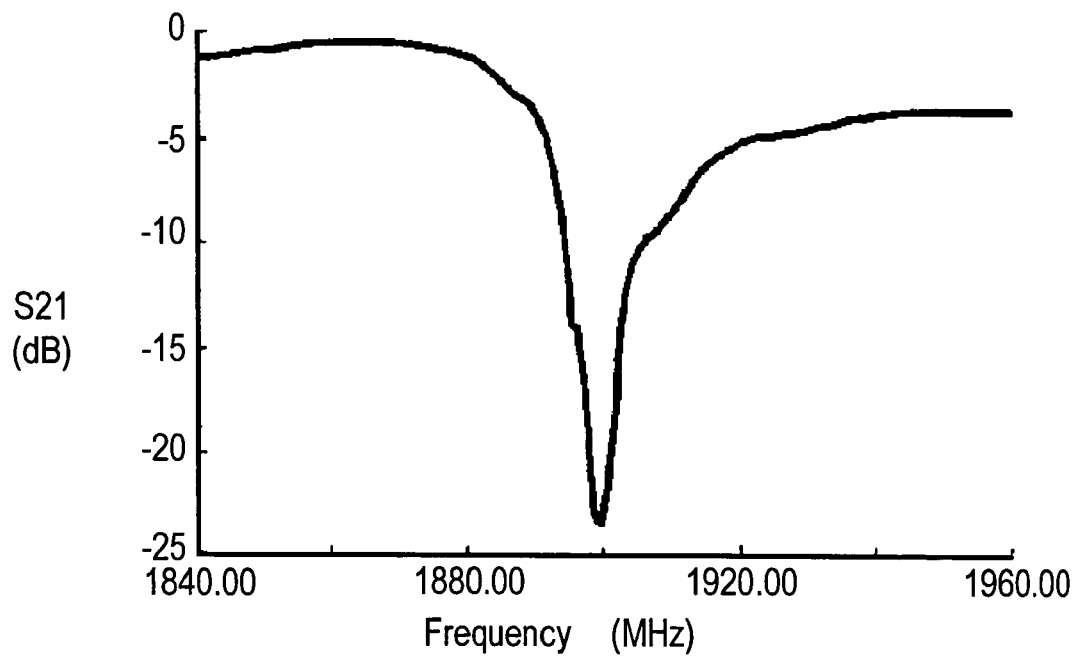
FIG. 14A shows transmission characteristics before dielectric film is formed in the 1-port SAW resonator of sample 8 in the fourth embodiment.
Figure 14B:
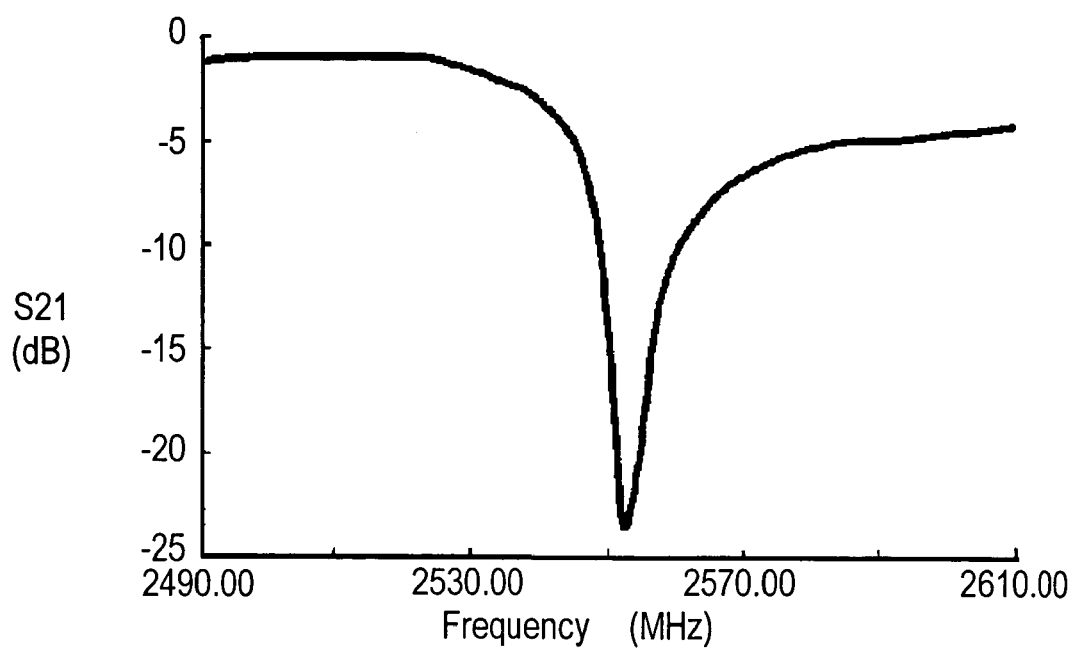
FIG. 14B shows transmission characteristics after the dielectric film is formed in the 1-port SAW resonator of sample 8 in the fourth embodiment.
Figure 15:
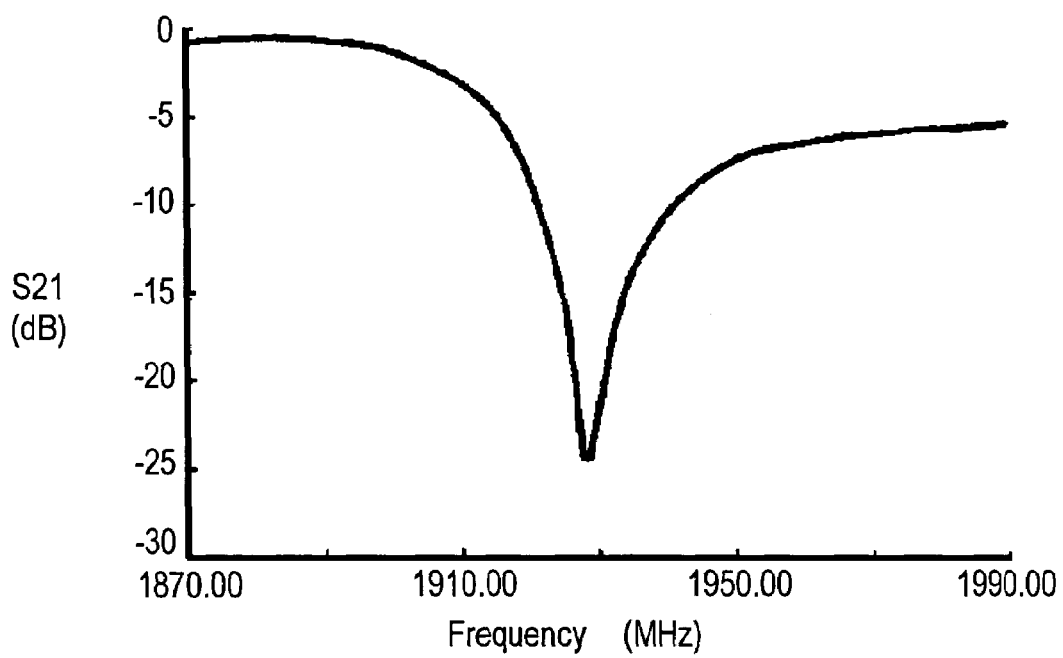
FIG. 15 shows transmission characteristics of comparison sample 5 with the 1-port SAW resonator in accordance with the fourth embodiment.
Figure 16:
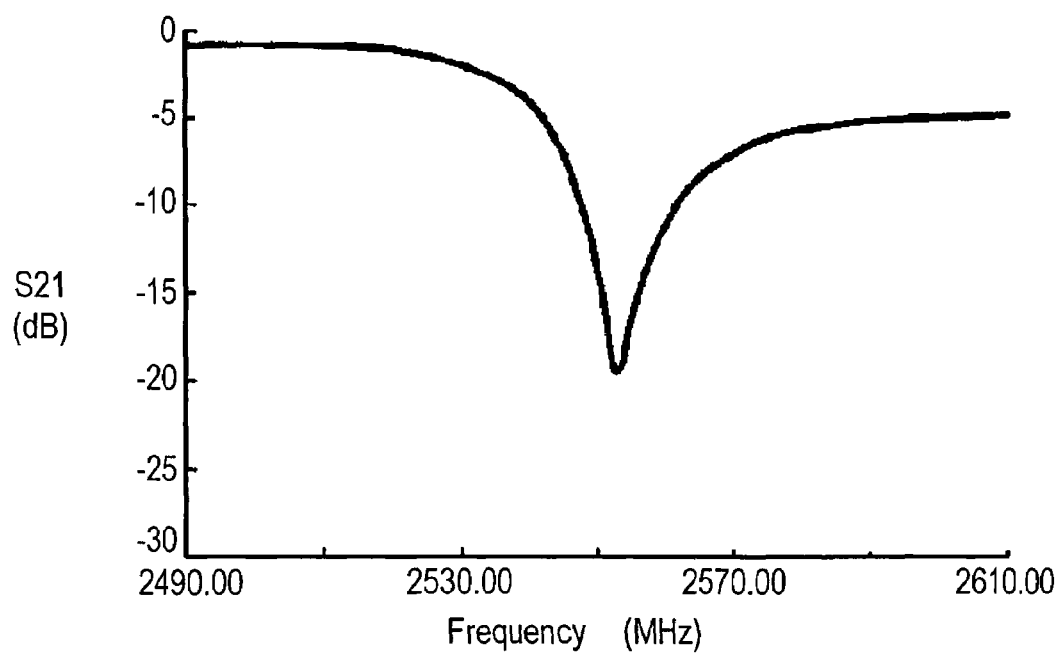
FIG. 16 shows transmission characteristics of comparison sample 6 with the 1-port SAW resonator in accordance with the fourth embodiment.

FIGS. 13A and 13B show transmission characteristics of sample 7 before and after dielectric film 12 is formed. FIGS. 14A and 14B show transmission characteristics of sample 8 before and after dielectric film 13 is formed. FIGS. 15 and 16 show transmission characteristics of comparison samples 5 and 6, respectively.

Those SAW resonators discussed above are basically produced in the same way and evaluated in the same manner as the first embodiment. The dielectric films of samples 7 and 8 are formed in the following way. First, form the electrode-pattern is formed, then the dielectric film is formed on the entire wafer by sputtering, and remove the dielectric film is removed only from a pad-area, where a probing device needs to contact for measuring the electrical characteristics, by photo-lithography and etching. The characteristics of those samples are shown in Table 4.

TABLE 4

| | | | without dielectric film | |
| --- | --- | --- | --- | --- |
| | Piezoelectric substrate | Pitch between finger electrodes p (µm) | Resonance frequency f (MHz) | SAW velocity (m/s) |
| sample 7 | 36° LT substrate | 0.8 | 1885.5 | 3016.7 |
| sample 8 | 36° LT substrate | 0.8 | 1848.4 | 2957.4 |
| Comparison sample 5 | 36° LT substrate | 1.06 | 1880.3 | 4001.3 |
| Comparison sample 6 | 36° LT substrate | 0.81 | 2465.7 | 4004.3 |

| | | | | with dielectric film | |
| --- | --- | --- | --- | --- | --- |
| | Piezoelectric substrate | Insertion loss index (dB) | Sharpness index | Resonance frequency f (MHz) | SAW velocity (m/s) |
| sample 7 | 36° LT substrate | −1 | 2465.9 | 1876.3 | 3002.1 |
| sample 8 | 36° LT substrate | −1.1 | 2191.7 | 2484.2 | 3974.7 |
| Comparison sample 5 | 36° LT substrate | −2.6 | 2053.3 | — | — |
| Comparison sample 6 | 36° LT substrate | −2.8 | 2097.7 | — | — |

As FIGS. 13A and 13B illustrate, sample 7 obtains improved insertion-loss and steep characteristics after formation of silicon-nitride film 12. In comparison with comparison sample 5 shown in FIG. 15, sample 7 has insertion-loss and steep characteristics that are rather inferior to those of comparison sample 5 before film 12 is formed. However, after film 12 is formed, sample 7 gets better characteristics than those of comparison sample 5. This experiment proves that the advantage of the present invention can be obtained after the dielectric film, such as silicon-nitride film 12, is formed.

Sample 8 shows an increase of the resonance frequency after silicon-oxide film 13 is formed. As the comparison of FIG. 14A with FIG. 14B shows, there are no substantial changes in the insertion-loss or the steep characteristics. In comparison with comparison sample 6 shown in FIG. 16, sample 8 shows better characteristics than a SAW resonator using the regular LSAW both before and after the dielectric film is formed.

When the phase velocity of the SAW increases due to forming of the dielectric film, such as silicon-oxide film 13, pitch "p" and resonance frequency $f_{before}$ are adjusted so that the relation of $2 \times p \times f_{before} \leq vb \leq 2 \times p \times f_{after}$ is satisfied, then a SAW resonator excellent in the insertion-loss and the steep characteristics is obtainable. In general, pitch "p" of a SAW resonator becomes wider at a lower frequency, therefore, in the foregoing case, the increase of SAW's phase velocity due to the dielectric film can be used for widening the pitch "p" of the SAW resonator. This is the advantage of manufacturing SAW devices.

Use of silicon-nitride film as the dielectric film decreases the resonance frequency. However, a degree of the decrease can be adjusted with the film thickness. Comparison sample 6 having the phase velocity of 4004.3 m/s before the dielectric film is formed. The silicon-nitride film thicker than that of sample 7 is formed on the surface of SAW resonator, of which the phase velocity is faster than that of the slow shear wave, then reduction of resonance frequency can be expected after the film is formed. Selection of an appropriate film thickness can satisfy the relation of $2 \times p \times f_{after} \leq vb$, and obtains the advantage of the present invention.

In this fourth embodiment, silicon-nitride film or silicon-oxide film is used as the dielectric film. However, the present invention is not limited to those materials. For instance, a film laminated of polyimide-based resin or silicon-nitride film, and silicon-oxide film can be used. Further, in this embodiment, the dielectric film is provided on the upper face of IDT electrodes. However, the dielectric film can be formed directly on the piezoelectric substrate, and the IDT electrodes are formed thereon, or they can be combined. Those methods also produce a similar advantage to what is discussed above.

A change in phase velocity due to forming of the dielectric film depends on a material of the film, a film thickness, and a structure of the film. There is, thus, an optimum condition for each one of those factors to produce SAW devices according to actual cases.

Exemplary Embodiment 5

The SAW device in accordance with the fifth embodiment of the present invention includes a ladder SAW filter working in the 800 MHz band and a ladder SAW filter working in the 1.9 GHz band, where both filters are formed on one chip, i.e., a filter of two-filters in one-chip. In this embodiment, four samples are produced, namely, samples 9 and 10, and comparison samples 7 and 8. A transmitting filter for AMPS/CDMA in the US is used as an 800 MHZ band filter, and a transmitting filter for CDMA in the PCS band in the US is used as a 1.9 GHZ band filter.

The transmitting filter in the 800 MHz band needs the following specifications: pass-band=824–849 MHz; insertion-loss$\leq$2.5 dB; rejection band in receiving band=869–894 MHz; and degree of attenuation $\geq$40 dB. On the other hand, the transmitting filter in the 1.9 GHz band needs the following specifications (requested specifications): pass-band=1850–1910 MHz; insertion-loss $\leq$2.5 dB; rejection band in receiving band=1930–1990 MHz; and degree of attenuation $\geq$40 dB.

In sample 9, Al-film is formed on a 39° LT substrate, and ladder SAW filters for the 800 MHz band and the 1.9 GHz band are produced by photo-lithograph and etching methods. The SAW resonator of this 800 MHz filter has IDT electrodes of which normalized film-thickness h/λ is ca. 6.0%, so that this SAW resonator has the specification agreeing with the condition that the SAW resonator employing the 39° LT substrate and using the LSAW incurs a propagation-loss of almost 0 (zero). The SAW resonator forming this 800 MHz SAW filter uses the LSAW, and its relation between resonance frequency and pitch of electrodes does not satisfy the relation of $2 \times p \leq vb/f$.

The ladder SAW filter for 1.9 GHz includes a SAW resonator, of which resonance frequency "f" and pitch "p" of electrodes are designed such that the relation of $2 \times p \leq vb/f$ is satisfied, thus the phase velocity of the LSAW is lowered and the LSAW is used as the RSAW.

In sample 10, W and Al are layered in this order on the 39° LT substrate, then patterns of ladder SAW filters for 800

MHz and 1.9 GHz are formed thereon by photo-lithography and etching methods. In this case, first the Al layer is etched by Cl-based gas as dry-etching gas, then the W layer is etched by F-based gas without exposing the layers to the atmosphere. Next, a resist is removed, then a filter pattern of the 800 MHz filter is protected by the resist, and the Al layer of a filter pattern of the 1.9 GHz filter is etched by Cl-based gas again. As a result, the IDT electrodes of the 800 MHz filter are formed of two layers, i.e., W layer and Al layer, and those of the 1.9 GHz filter are formed of single layer, i.e., W layer.

The SAW resonator of this 800 MHz SAW filter of sample 10 uses the LSAW and its resonance frequency "f", as well as pitch "p" of electrodes, and does not satisfy the relation of $2 \times p \leq vb/f$. The SAW resonator of the ladder SAW filter for the 1.9 GHz band is designed such that resonance frequency "f" and pitch "p" satisfy the relation of $2 \times p \leq vb/f$. This 1.9 GHz filter, thus, uses the LSAW as the RSAW by lowering the phase velocity of the LSAW.

In comparison sample 7, first, Al-film, of which thickness corresponds to that of the 1.9 GHz filter, is formed on the 39° LT substrate. Second, the filter section of 1.9 GHz is protected with resist, then Ti-film and Al-film are formed in this order to make the film-thickness to be that of an 800 MHz filter. In this case, the Ti-film is used as an adhering layer. The resist protecting the filter section of 1.9 GHz band is removed together with the Ti-film and Al-film attached to the filter section. Then resist is applied for protecting the filter section of 1.9 GHz band and the pattern of the 800 MHz filter is formed. The resist is exposed to light, then the resist is provided with dry-etching, thereby producing a filter for the 800 MHz band and a filter for the 1.9 GHz band on one chip.

The SAW resonators of the 800 MHz filter and the 1.9 GHz filter in comparison sample 7 use the LSAW, and the relation between resonance frequency "f" and pitch "p" does not satisfy the relation of $2 \times p \leq vb/f$. In comparison sample 8, Al and W are layered in this order on the 39° LT substrate, then patterns of ladder SAW filters for 800 MHz and 1.9 GHz are formed thereon by photo-lithography and etching methods. In this case, first the W layer is etched by F-based gas as dry-etching gas, then the W layer is etched by Cl-based gas without exposing the layers to the atmosphere. Next, a resist is removed, then a filter pattern of the 800 MHz filter is protected by the resist again, and the W layer of a filter pattern of the 1.9 GHz filter is etched by F-based gas. As a result, the IDT electrodes of the 1.9 GHz filter are formed of single layer, i.e., W layer, and those of the 800 MHz filter are formed of two layers, i.e., W layer and Al layer.

The SAW resonators of the 800 MHz filter and the 1.9 GHz filter in comparison sample 8 both use the LSAW, and their frequency "f" and pitch "p" do not satisfy the relation of $2 \times p \leq vb/f$.

For samples 9 and 10, and comparison samples 7 and 8, after the patterns of IDT electrodes are formed, Al-film is vapor-deposited for reinforcing purposes on the wiring routed, bus-bars, and pad sections. Then those wafers are diced into a number of chips, which are then die-bonded on ceramic-packages of 3 mm squared. They are electrically connected with wire-bonding, and air-tightly sealed in a nitrogen atmosphere.

Figure 17A:
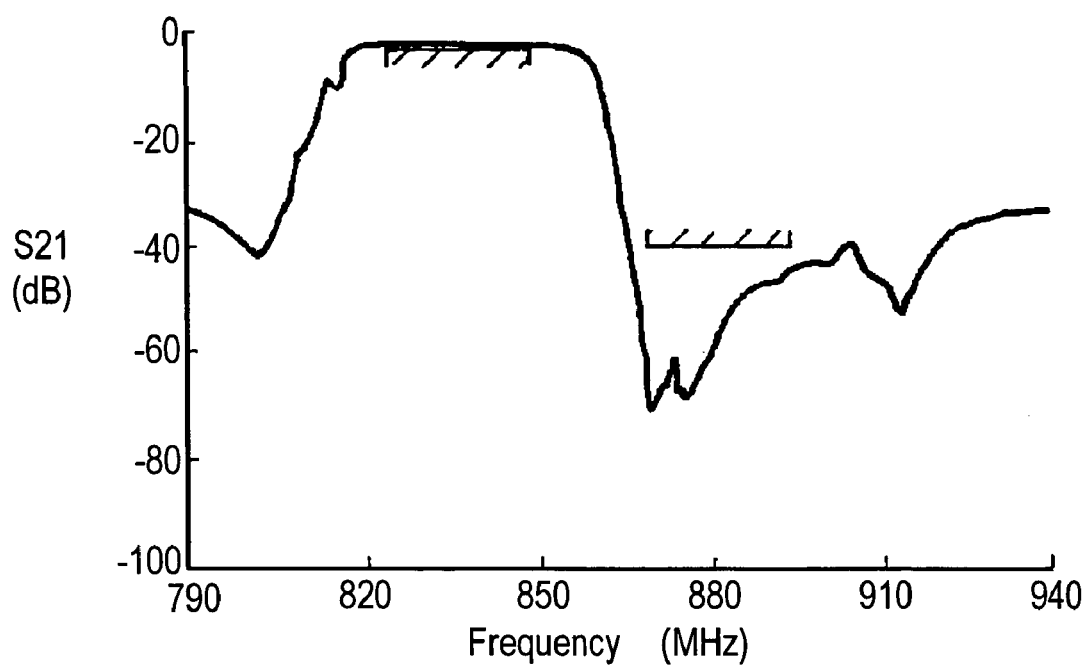
FIG. 17A shows transmission characteristics of a ladder SAW filter for 800 MHz band out of two-filters in one-chip SAW filters of sample 9 in accordance with a fifth exemplary embodiment of the present invention.
Figure 17B:
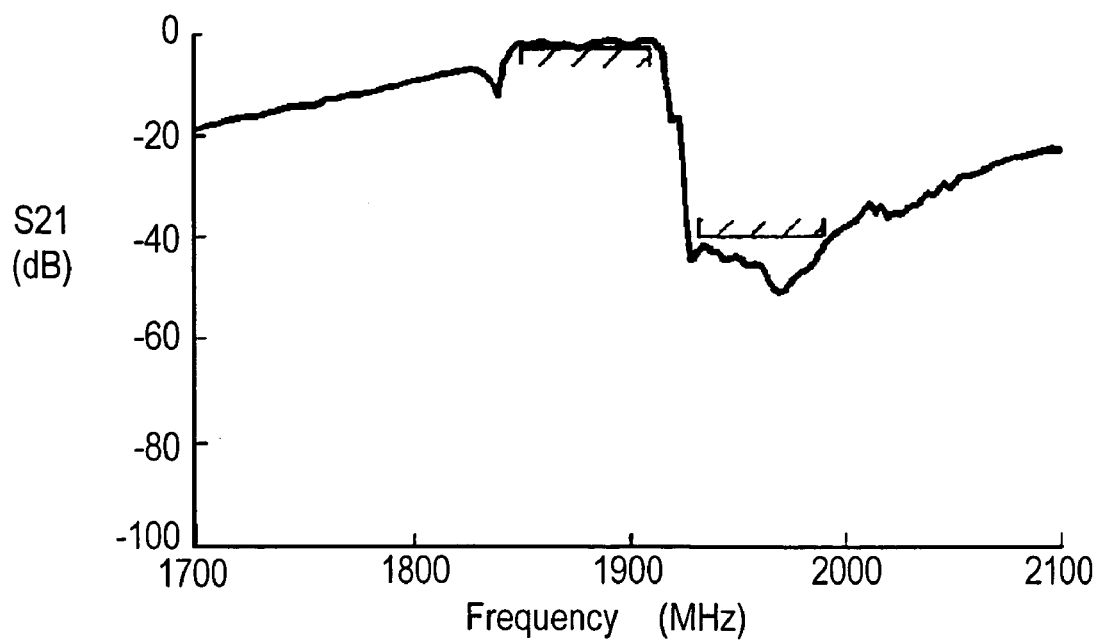
FIG. 17B shows transmission characteristics of a ladder SAW filter for 1.9 GHz band out of a two-filter in one-chip SAW filter of sample 9 used in the fifth embodiment.
Figure 18A:
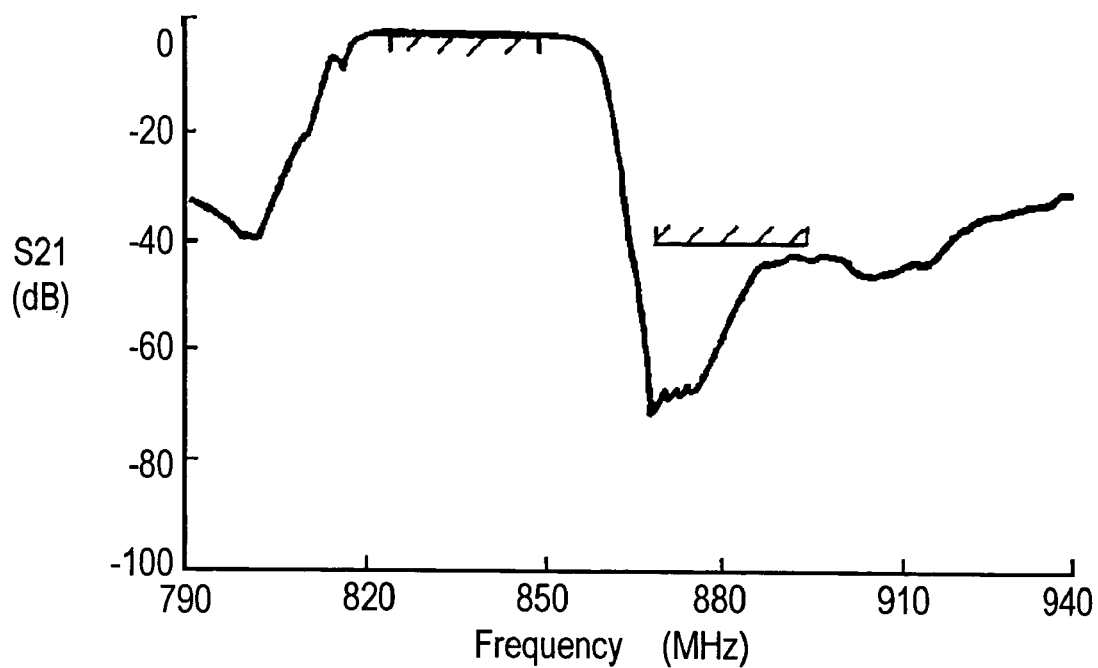
FIG. 18A shows transmission characteristics of a ladder SAW filter for 800 MHz band out of a two-filter in one-chip SAW filter of sample 10 used in the fifth embodiment.
Figure 18B:
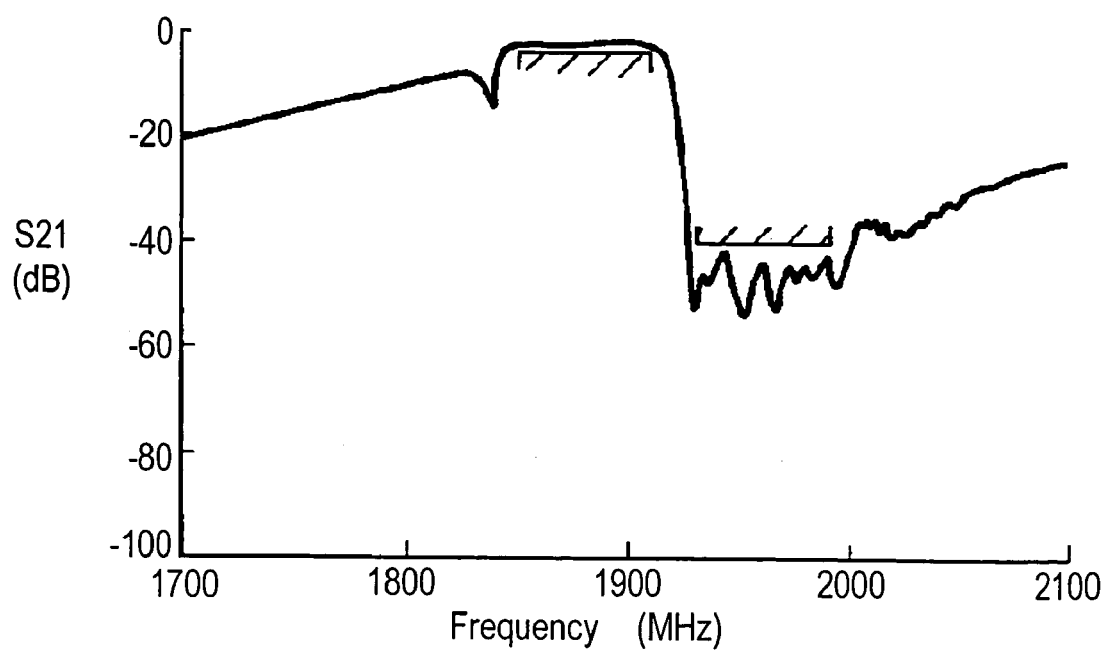
FIG. 18B shows transmission characteristics of a ladder SAW filter for 1.9 GHz band out of a two-filter in one-chip SAW filter of sample 10 used in the fifth embodiment.
Figure 19A:
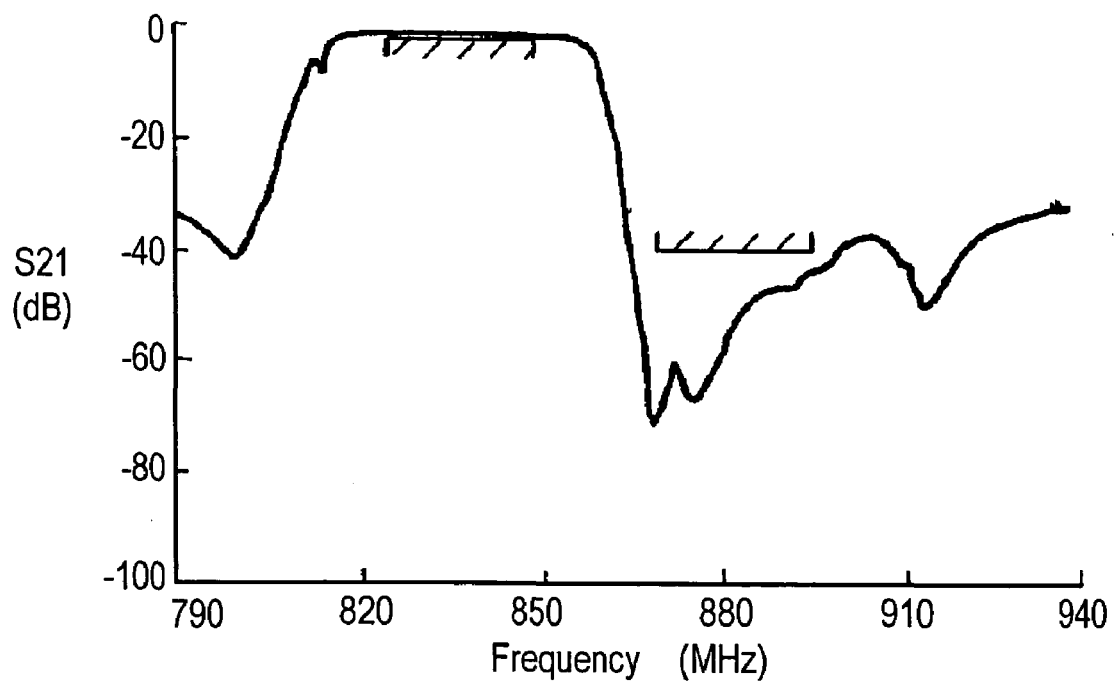
FIG. 19A shows transmission characteristics of a ladder SAW filter for 800 MHz band out of a two-filter in one-chip SAW filter of comparison sample 7 used in the fifth exemplary embodiment.
Figure 19B:
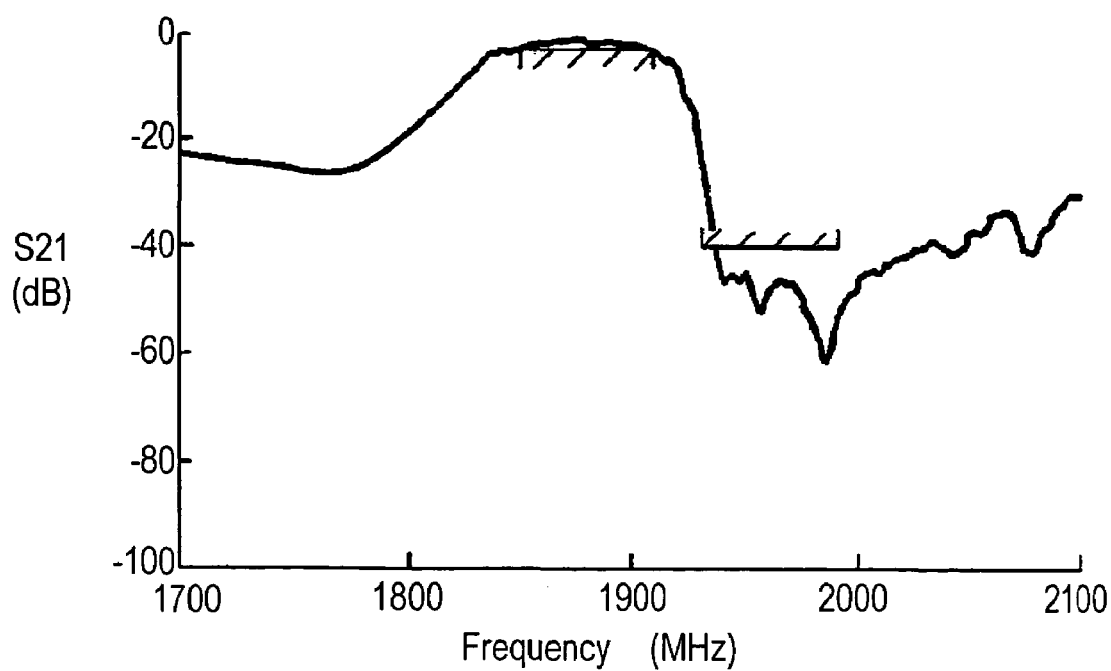
FIG. 19B shows transmission characteristics of a ladder SAW filter for 1.9 GHz band out of a two-filter in one-chip SAW filter of comparison sample 7 used in the fifth embodiment.
Figure 20A:
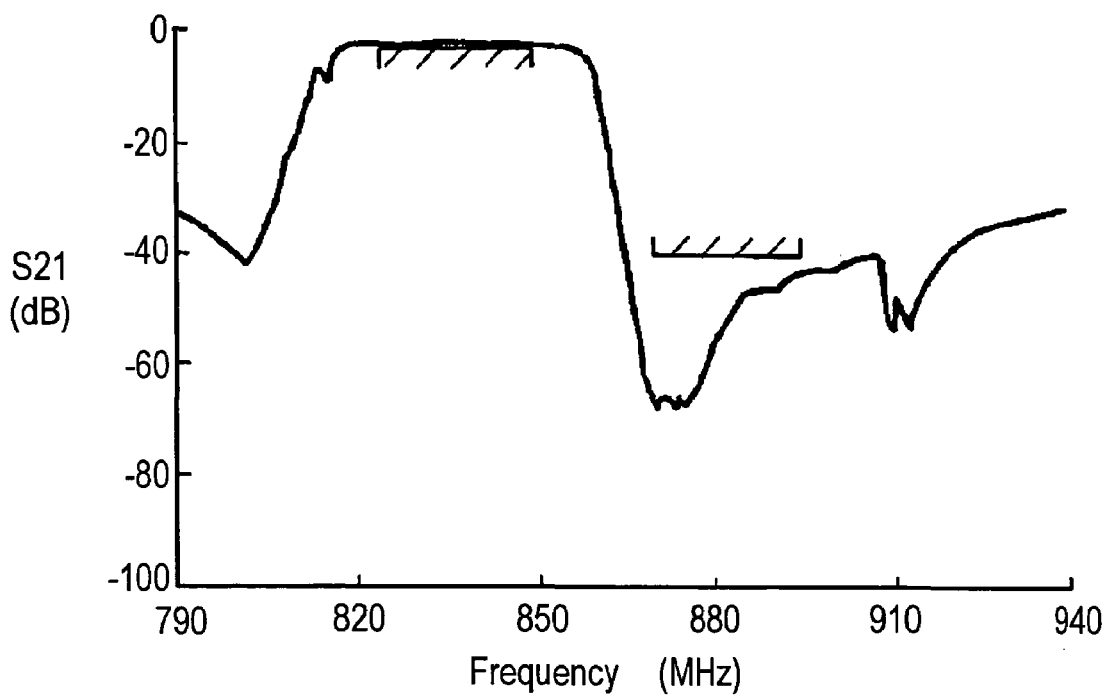
FIG. 20A shows transmission characteristics of a ladder SAW filter for 800 MHz band out of a two-filter in one-chip SAW filter of comparison sample 8 used in the fifth exemplary embodiment.
Figure 20B:
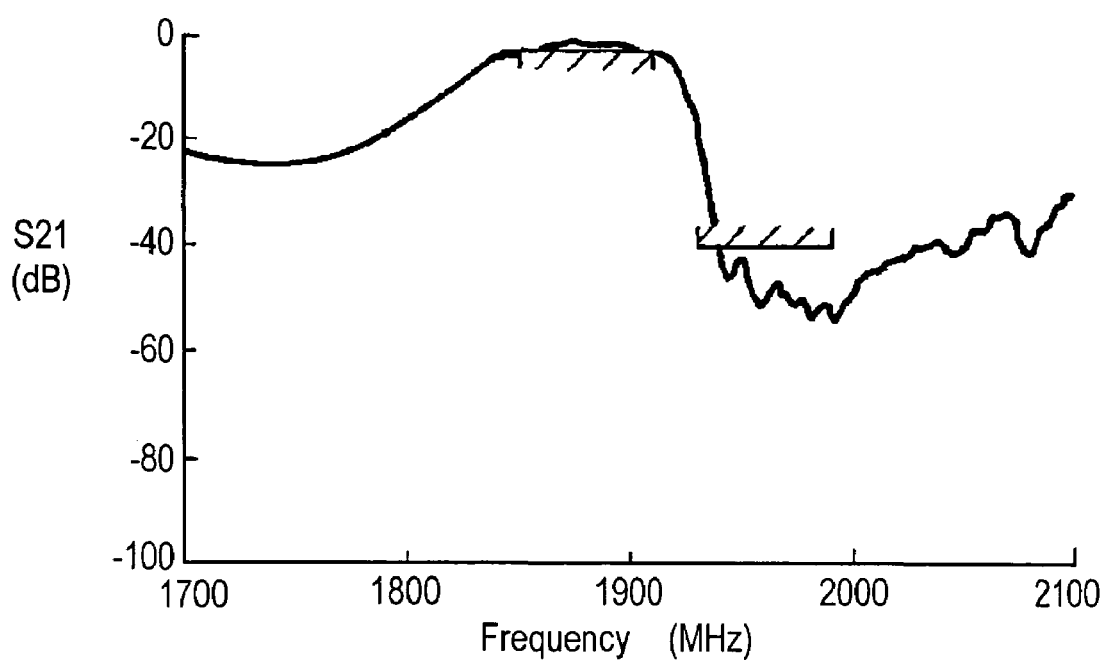
FIG. 20B shows transmission characteristics of a ladder SAW filter for 1.9 GHz band out of a two-filter in one-chip SAW filter of comparison sample 8 used in the fifth embodiment.

FIGS. 17A and 17B show the transmission characteristics of sample 9, FIGS. 18A and 18B show that of sample 10, FIGS. 19A and 19B show that of comparison sample 7, and FIGS. 20A and 20B show the transmission characteristics of comparison sample 8. Each drawing also shows the respective pass-band (transmitting band) and rejection band (receiving band).

A detailed observation of those results proves that samples 9, 10 and comparison samples 7, 8 obtain the characteristics substantially equal to each other on the 800 MHz SAW filters. Samples 9 and 10 satisfy the requested specifications of the 1.9 GHz SAW filters by lowering the phase velocity of the wave, which should have propagated as the LSAW, for using the wave as the RSAW. On the other hand, comparison samples 7 and 8 do not satisfy the requested specifications with respect to the insertion-loss and the degree of attenuation in the rejection-band. A comparison of sample 9 with sample 10 shows that sample 10 has almost no ripples which sample 9 has, which seems to be caused by the IDT electrodes made of W.

Although the electrodes of sample 10 are made of only W, sample 10 has the insertion-loss similar to that of other samples. Because the IDT electrodes of the SAW resonator hardly affects the loss, and the wiring routed is reinforced with Al. Comparison sample 7 finally obtains characteristics on only few items because of its complicated production process, and results in a poor yield.

Exemplary Embodiment 6

A sensor employing the SAW device of the present invention is demonstrated hereinafter with reference to the accompanying drawings.

Figure 21:
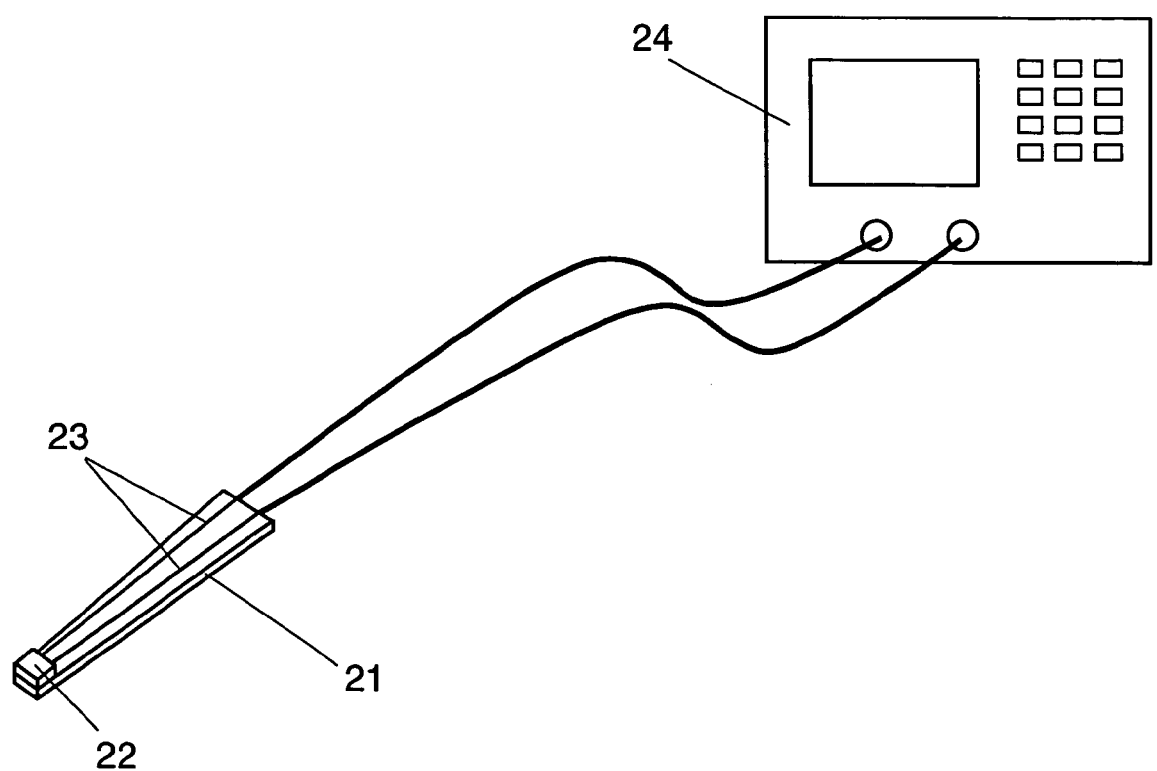
FIG. 21 shows a schematic diagram illustrating a basic structure of a SAW device used as a temperature sensor in a sixth exemplary embodiment of the present invention.

A temperature sensor is taken as an instance of the sensor employing the SAW device. FIG. 21 shows a schematic diagram illustrating a basic structure of this sensor. In FIG. 21, packaged SAW resonator 22 is mounted to a tip of insulating member 21, and an output section of resonator 22 is electrically coupled to network analyzer 24 via wires 23 disposed on insulating member 21. This temperature sensor uses SAW resonator 22 as its sensing section, and analyzer 24 measures the transmission characteristics of resonator 22.

SAW resonator 22 changes its frequency characteristics in response to an ambient temperature, and this temperature sensor can thus measure the temperature using a change in the frequency. In this sixth embodiment, a movement of anti-resonance frequency due to a change in temperature is monitored.

The SAW resonator used in sample 1 described in the first embodiment is used as SAW resonator 22. Sensor 1 equipped with this SAW resonator and a comparison sensor equipped with the SAW resonator used in comparison sample 1 in the first embodiment are used here.

Figure 22:
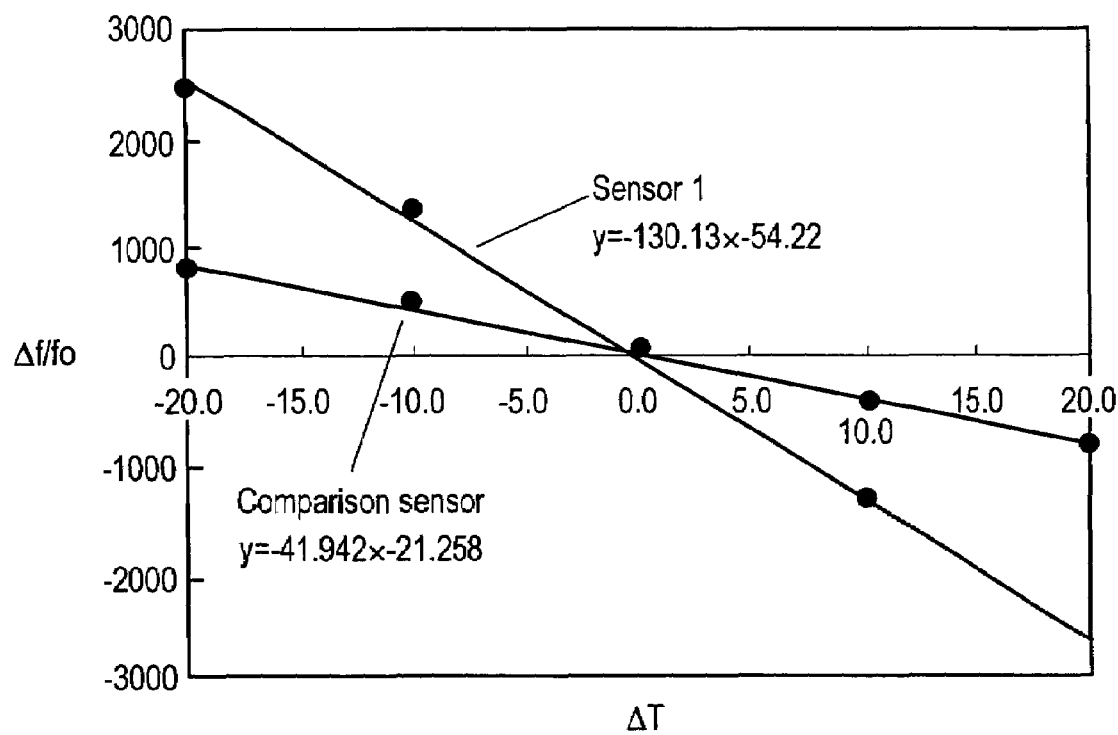
FIG. 22 shows a relation between ambient temperatures and anti-resonance frequencies in the sixth embodiment.

The characteristics of those two sensors are evaluated in the following manner. The sensing section, i.e. SAW resonator 22, is placed into an oven, and a relation between a variation in the ambient temperature and a variation in the anti-resonance frequency with the ambient temperature varying is found. The resultant relation is shown in FIG. 22, in which the vertical axis shows a variation in the anti-resonance frequencies and the horizontal axis shows a difference in temperature from room temperature (25° C.). The result proves that the temperature characteristics of sensor 1 is ca. 130 ppm/K, while that of the comparison sensor is 35 ppm/K. FIGS. 3A and 3B used in the first embodiment also show that the characteristics of sensor 1 around the anti-resonance frequency is sharper than that of the comparison sensor. It can be thus concluded that sensor 1 can measure a temperature more sensitively than the comparison sensor.

The temperature characteristics discussed above takes advantage of the fact that temperature characteristics of a substrate can be changed by thickening a film-thickness of IDT electrodes. In this case, when the electrodes made of Al are used, the IDT electrodes preferably have normalized film thickness h/λ of not less than 10%.

INDUSTRIAL APPLICABILITY

The present invention lowers the phase velocity of the LSAW to not more than that of the slow shear wave propagating on a piezoelectric substrate, so that a bulk-wave is prevented from radiating for reducing the loss of a SAW device such as a SAW resonator or a SAW filter. At the same time, the steep characteristics of the SAW device can be increased.

The invention claimed is:

1. A surface acoustic wave (SAW) device comprising:
   a piezoelectric substrate cut out at a cut-angle allowing excitation of a leaky surface acoustic wave (LSAW); and
   an electrode pattern formed of an inter-digital transducer (IDT) electrode prepared on said piezoelectric substrate, said IDT electrode having at least a pair of finger-electrodes meshing with each other,
   wherein
   a pitch p (m) of said finger-electrodes satisfies a relation of $2 \times p \leq vb/f$, where vb (m/s) is a phase velocity of a slow shear wave propagating on said piezoelectric substrate, and f(Hz) is a resonance frequency of said SAW device, and
   said piezoelectric substrate has a step and said finger-electrodes of said electrode pattern are formed on a top of said step on said piezoelectric substrate, said step having a pitch similar to the pitch p.

2. The SAW device of claim 1, further comprising a dielectric film disposed over said electrode pattern for covering at least said electrode pattern.

3. The SAW device of claim 1, wherein said finger-electrodes are made of one of aluminum (Al) and a metal comprising mainly Al, and a relation of $hL \leq hr$ is satisfied, where hL is a film thickness of an IDT electrode of another SAW device using the LSAW and said piezoelectric substrate, and hr is a film thickness of said IDT electrode of said SAW device of which a resonance frequency is equal to that of the another SAW device.

4. The SAW device of claim 3, wherein said piezoelectric substrate is made of a single crystal of $LiTaO_3$.

5. The SAW device of claim 4, wherein said piezoelectric substrate made of the single crystal of $LiTaO_3$ has a cut-face cut out at a rotation angle of not less than 26° and not more than 50° from a Y-axis to a Z-axis with respect to an X-axis of the single-crystal of $LiTaO_3$, and said piezoelectric substrate allows for excitation of the LSAW.

6. The SAW device of claim 3, wherein said piezoelectric substrate is made of a single crystal of $LiNbO_3$.

7. The SAW device of claim 6, wherein said piezoelectric substrate made of the single crystal of $LiNbO_3$ has a cut-face cut out at a rotation angle of not less than 50° to not more than 80° with respect to an X-axis of the single-crystal of $LiNbO_3$, and said piezoelectric substrate allows for excitation of the LSAW.

8. The SAW device of claim 1, wherein at least said finger-electrodes are made of a metal having a larger density than Al.

9. The SAW device of claim 6, wherein said piezoelectric substrate is made of a single crystal of $LiTaO_3$.

10. The SAW device of claim 9, wherein said piezoelectric substrate made of the single crystal of $LiTaO_3$ has a cut-face cut out at a rotation angle of not less than 26° and not more than 50° from a Y-axis to a Z-axis with respect to an X-axis of the single-crystal of $LiTaO_3$, and said piezoelectric substrate allows for excitation of the LSAW.

11. The SAW device of claim 8, wherein said piezoelectric substrate is made of a single crystal of $LiNbO_3$.

12. The SAW device of claim 11, wherein said piezoelectric substrate made of the single crystal of $LiNbO_3$ has a cut-face cut out at a rotation angle of not less than 50° to not more than 80° with respect to an X-axis of the single-crystal of $LiNbO_3$, and said piezoelectric substrate allows for excitation the LSAW.

13. The SAW device of claim 1, wherein at least said finger-electrodes are formed of at least two layers, a first layer being made of a metal having a greater density than Al, and a second layer being formed of one of Al and a metal comprising mainly Al.

14. The SAW device of claim 13, wherein said piezoelectric substrate is made of a single crystal of $LiTaO_3$.

15. The SAW device of claim 14, wherein said piezoelectric substrate made of the single crystal of $LiTaO_3$, has a cut-face cut out at a rotation angle of not less than 26° and not more than 50° from a Y-axis to a Z-axis with respect to an X-axis of the single-crystal of $LiTaO_3$, and said piezoelectric substrate allows for excitation of the LSAW.

16. The SAW device of claim 13, wherein said piezoelectric substrate is made of a single crystal of $LiNbO_3$.

17. The SAW device of claim 16, wherein said piezoelectric substrate made of the single crystal of $LiNbO_3$ has a cut-face cut out at a rotation angle of not less than 50° to not more than 80° with respect to an X-axis of the single-crystal of $LiNbO_3$, and said piezoelectric substrate allows for excitation of the LSAW.

18. The SAW device of claim 1, wherein said piezoelectric substrate is made of a single crystal of $LiTaO_3$.

19. The SAW device of claim 18, wherein said piezoelectric substrate made of the single crystal of $LiTaO_3$ has a cut-face cut out at a rotation angle of not less than 26° and not more than 50° from a Y-axis to a Z-axis with respect to an X-axis of the single-crystal of $LiTaO_3$, and said piezoelectric substrate allows for excitation of the LSAW.

20. The SAW device of claim 1, wherein said piezoelectric substrate is made of a single crystal of $LiNbO_3$.

21. The SAW device of claim 20, wherein said piezoelectric substrate made of the single crystal of $LiNbO_3$ has a cut-face cut out at a rotation angle of not less than 50° to not more than 80° with respect to an X-axis of the single-crystal of $LiNbO_3$, and said piezoelectric substrate allows for excitation of the LSAW.

22. A surface acoustic wave (SAW) apparatus comprising at least two of said SAW devices, as defined in claim 1, combined to each other and formed on one chip.

23. A mobile communication apparatus employing said SAW device as defined in claim 22.

24. A sensor employing said SAW device as defined in claim 1.

25. A mobile communication apparatus employing said SAW device as defined in claim 1.

26. A method of manufacturing a surface acoustic wave (SAW) device, said method comprising:
   forming an electrode pattern of an inter-digital transducer (IDT) electrode prepared on a piezoelectric substrate cut out at a cut-angle allowing excitation of a leaky surface acoustic wave (LSAW), the IDT electrode having at least a pair of finger-electrodes meshing with each other; and disposing a dielectric film over the electrode pattern for covering at least the electrode pattern, wherein the electrode pattern, the cut-angle and a material of the dielectric film satisfy a relation of $$2 \times p \times f_{before} \leq vb \leq 2 \times p \times f_{after},$$

where $f_{before}$ (Hz) is a resonance frequency of the SAW device before the dielectric film is formed, $f_{after}$ (Hz) is a resonance frequency of the SAW device after the dielectric film is formed, p (m) is a pitch of the finger-electrodes of the electrode pattern, vb (m/s) is a phase velocity of a slow shear wave propagating on the piezoelectric substrate.

27. A method of manufacturing the SAW device as defined in claim 26, wherein the finger-electrodes of the SAW device are made of one of aluminum (Al) and a metal comprising mainly Al, and the electrode pattern and the cut-angle satisfy a relation of hL≦hr, where hL is a film thickness of an IDT electrode of another SAW device using the LSAW and the piezoelectric substrate, and hr is a film thickness of the IDT electrode of the SAW device of which a resonance frequency is equal to that of the another SAW device.

28. A surface acoustic wave (SAW) device comprising:
a piezoelectric substrate cut out at a cut-angle allowing excitation of a leaky surface acoustic wave (LSAW);
an electrode pattern formed of an inter-digital transducer (IDT) electrode prepared on said piezoelectric substrate, said IDT electrode having at least a pair of finger-electrodes meshing with each other; and
a dielectric film disposed over said electrode pattern for covering at least said electrode pattern,
wherein a pitch p (m) of said finger-electrodes satisfies a relation of $2 \times p \times f_{before} \leq vb \leq 2 \times p \times f_{after}$, where f before (Hz) is a resonance frequency of said SAW device before said dielectric film is formed, $f_{after}$ (Hz) is a resonance frequency of said SAW device after said dielectric film is formed, and vb (m/s) is a phase velocity of a slow shear wave propagating on said piezoelectric substrate.

29. The SAW device of claim 28, wherein said finger-electrodes are made of one of aluminum (Al) and a metal comprising mainly Al, and a relation of hL≦hr is satisfied, where hL is a film thickness of an IDT electrode of another SAW device using the LSAW and said piezoelectric substrate, and hr is a film thickness of said IDT electrode of said SAW device of which a resonance frequency is equal to that of the another SAW device.

30. The SAW device of claim 29, wherein said piezoelectric substrate is made of a single crystal of LiTaO$_3$.

31. The SAW device of claim 30, wherein said piezoelectric substrate made of the single crystal of LiTaO$_3$ has a cut-face cut out at a rotation angle of not less than 26° and not more than 50° from a Y-axis to a Z-axis with respect to an X-axis of the single-crystal of LiTaO$_3$, and said piezoelectric substrate allows for excitation of the LSAW.

32. The SAW device of claim 29, wherein said piezoelectric substrate is made of a single crystal of LiNbO$_3$.

33. The SAW device of claim 32, wherein said piezoelectric substrate made of the single crystal of LiNbO$_3$ has a cut-face cut out at a rotation angle of not less than 50° to not more than 80° with respect to an X-axis of the single-crystal of LiNbO$_3$, and said piezoelectric substrate allows for excitation of the LSAW.

34. The SAW device of claim 28, wherein at least said finger-electrodes are made of a metal having a larger density than Al.

35. The SAW device of claim 34, wherein said piezoelectric substrate is made of a single crystal of LiTaO$_3$.

36. The SAW device of claim 35, wherein said piezoelectric substrate made of the single crystal of LiTaO$_3$ has a cut-face cut out at a rotation angle of not less than 26° and not more than 50° from a Y-axis to a Z-axis with respect to an X-axis of the single-crystal of LiTaO$_3$, and said piezoelectric substrate allows for excitation of the LSAW.

37. The SAW device of claim 34, wherein said piezoelectric substrate is made of a single crystal of LiNbO$_3$.

38. The SAW device of claim 37, wherein said piezoelectric substrate made of the single crystal of LiNbO$_3$ has a cut-face cut out at a rotation angle of not less than 50° to not more than 80° with respect to an X-axis of the single-crystal of LiNbO$_3$, and said piezoelectric substrate allows for excitation of the LSAW.

39. The SAW device of claim 28, wherein at least said finger-electrodes are formed of at least two layers, a first layer being made of a metal having a greater density than Al, and a second layer being formed of one of Al and a metal comprising mainly Al.

40. The SAW device of claim 39, wherein said piezoelectric substrate is made of a single crystal of LiTaO$_3$.

41. The SAW device of claim 40, wherein said piezoelectric substrate made of the single crystal of LiTaO$_3$ has a cut-face cut out at a rotation angle of not less than 26° and not more than 50° from a Y-axis to a Z-axis with respect to an X-axis of the single-crystal of LiTaO$_3$, and said piezoelectric substrate allows for excitation of the LSAW.

42. The SAW device of claim 39, wherein said piezoelectric substrate is made of a single crystal of LiNbO$_3$.

43. The SAW device of claim 42, wherein said piezoelectric substrate made of the single crystal of LiNbO$_3$ has a cut-face cut out at a rotation angle of not less than 50° to not more than 80° with respect to an X-axis of the single-crystal of LiNbO$_3$, and said piezoelectric substrate allows for excitation of the LSAW.

44. The SAW device of claim 28, wherein said piezoelectric substrate is made of a single crystal of LiNbO$_3$.

45. The SAW device of claim 44, wherein said piezoelectric substrate made of the single crystal of LiTaO$_3$ has a cut-face cut out at a rotation angle of not less than 26° and not more than 50° from a Y-axis to a Z-axis with respect to an X-axis of the single-crystal of LiTaO$_3$, and said piezoelectric substrate allows for excitation of the LSAW.

46. The SAW device of claim 28, wherein said piezoelectric substrate is made of a single crystal of LiNbO$_3$.

47. The SAW device of claim 46, wherein said piezoelectric substrate made of the single crystal of LiNbO$_3$ has a cut-face cut out at a rotation angle of not less than 50° to not more than 80° with respect to an X-axis of the single-crystal of LiNbO$_3$, and said piezoelectric substrate allows for excitation of the LSAW.

48. A surface acoustic wave (SAW) apparatus comprising at least two of said SAW devices, as defined in claim 28, combined to each other and formed on one chip.

49. A mobile communication apparatus employing said SAW device as defined in claim 48.

50. A sensor employing said SAW device as defined in claim 28.

51. A mobile communication apparatus employing said SAW device as defined in claim 28.

* * * * *